(12) United States Patent
Ukumori

(10) Patent No.: US 10,996,282 B2
(45) Date of Patent: May 4, 2021

(54) ABNORMALITY FACTOR DETERMINATION APPARATUS, DEGRADATION DETERMINATION APPARATUS, COMPUTER PROGRAM, DEGRADATION DETERMINING METHOD, AND ABNORMALITY FACTOR DETERMINING METHOD

(71) Applicant: GS Yuasa International Ltd., Kyoto (JP)

(72) Inventor: Nan Ukumori, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 0 days.

(21) Appl. No.: 16/981,845

(22) PCT Filed: Mar. 14, 2019

(86) PCT No.: PCT/JP2019/010542
§ 371 (c)(1),
(2) Date: Sep. 17, 2020

(87) PCT Pub. No.: WO2019/181727
PCT Pub. Date: Sep. 26, 2019

(65) Prior Publication Data
US 2021/0048482 A1 Feb. 18, 2021

(30) Foreign Application Priority Data
Mar. 20, 2018 (JP) .............................. JP2018-053015

(51) Int. Cl.
*G01R 31/392* (2019.01)
*G01R 31/3842* (2019.01)
(Continued)

(52) U.S. Cl.
CPC ......... *G01R 31/392* (2019.01); *G01R 31/367* (2019.01); *G01R 31/374* (2019.01);
(Continued)

(58) Field of Classification Search
CPC .. G01R 31/392; G01R 31/374; G01R 31/367; G01R 31/3842; H01M 10/48;
(Continued)

(56) References Cited

U.S. PATENT DOCUMENTS 9,393,921 B1 * 7/2016 Weicker ............... G01R 31/382
2003/0184307 A1 * 10/2003 Kozlowski ............ H01M 10/48
324/427

(Continued)

FOREIGN PATENT DOCUMENTS

JP 2007-240308 A 9/2007
JP 2008-232758 A 10/2008
(Continued)

OTHER PUBLICATIONS

International Searching Authority, International Search Report and Written Opinion for International Application No. PCT/JP2019/010542, dated Jun. 18, 2019, (18 pages), Japanese Patent Office, Tokyo, Japan.

(Continued)

*Primary Examiner* — Mohammad K Islam
(74) *Attorney, Agent, or Firm* — Alston & Bird LLP

(57) ABSTRACT

This abnormal factor determination device is provided with a measured value acquisition unit which acquires measured values including electric values and temperature values of multiple power storage elements, a predicted value acquisition unit which acquires predicted values including electric values and temperature values of multiple power storage elements, and a determination unit which, on the basis of the acquired measured values and predicted values, determines whether or not there are abnormal factors in the power storage system.

15 Claims, 24 Drawing Sheets

(51) Int. Cl.
*G06N 20/00* (2019.01)
*G01R 31/367* (2019.01)
*G01R 31/374* (2019.01)
*H01M 10/42* (2006.01)
*H01M 10/48* (2006.01)
*H02J 3/32* (2006.01)
*H02J 3/38* (2006.01)

(52) U.S. Cl.
CPC ......... *G01R 31/3842* (2019.01); *G06N 20/00* (2019.01); *H01M 10/4285* (2013.01); *H01M 10/48* (2013.01); *H02J 3/32* (2013.01); *H02J 3/381* (2013.01)

(58) Field of Classification Search
CPC ...... H01M 10/4285; G06N 20/00; H02J 3/32; H02J 3/381
See application file for complete search history.

(56) References Cited

U.S. PATENT DOCUMENTS

| | | |
|---|---|---|
| 2008/0234956 A1 | 9/2008 | Mizuno et al. |
| 2013/0110429 A1 | 5/2013 | Mitsuyama et al. |
| 2014/0095092 A1* | 4/2014 | Ikeda ................... H01M 10/48 702/63 |
| 2016/0003912 A1 | 1/2016 | Iwane et al. |
| 2016/0018345 A1* | 1/2016 | Park ..................... G01R 31/367 702/63 |
| 2017/0294689 A1 | 10/2017 | Wada et al. |
| 2018/0292465 A1* | 10/2018 | Osara ................... G01M 5/0033 |
| 2019/0025379 A1* | 1/2019 | Pajovic ................... B60L 58/12 |
| 2019/0235027 A1* | 8/2019 | Sugiura ............... H01M 10/425 |
| 2020/0018797 A1* | 1/2020 | Gelso ..................... G01R 31/367 |
| 2020/0164763 A1* | 5/2020 | Holme ................... B60L 58/10 |

FOREIGN PATENT DOCUMENTS

| | | |
|---|---|---|
| JP | 2011-214843 A | 10/2011 |
| JP | 2012-052857 A | 3/2012 |
| JP | 2014-160039 A | 9/2014 |
| JP | 2014-178213 A | 9/2014 |
| JP | 2015-059933 A | 3/2015 |
| JP | 2018-147680 A | 9/2018 |
| WO | WO-2015/198631 A1 | 12/2015 |

OTHER PUBLICATIONS

International Searching Authority, International Search Report and Written Opinion for International Application No. PCT/JP2019/010542, dated Jun. 18, 2019, (10 pages), Japanese Patent Office, Tokyo, Japan.

* cited by examiner

Fig. 13

|  | Time | t1 | t2 | t3 | ... | tN |
|---|---|---|---|---|---|---|
| Measured value time-series data | Voltage | Va(t1) | Va(t2) | Va(t3) | ... | Va(tN) |
| | Current | Ia(t1) | Ia(t2) | Ia(t3) | ... | Ia(tN) |
| | Temperature | Ta(t1) | Ta(t2) | Ta(t3) | ... | Ta(tN) |
| | Pressure | Pa(t1) | Pa(t2) | Pa(t3) | ... | Pa(tN) |
| Predicted value time-series data | Voltage | Ve(t1) | Ve(t2) | Ve(t3) | ... | Ve(tN) |
| | Current | Ie(t1) | Ie(t2) | Ie(t3) | ... | Ie(tN) |
| | Temperature | Te(t1) | Te(t2) | Te(t3) | ... | Te(tN) |
| | Pressure | Pe(t1) | Pe(t2) | Pe(t3) | ... | Pe(tN) |

Fig. 14

| Time | t1 | t2 | t3 | ... | tN |
|---|---|---|---|---|---|
| Voltage difference | Va(t1)−Ve(t1) | Va(t2)−Ve(t2) | Va(t3)−Ve(t3) | ... | Va(tN)−Ve(tN) |
| Current difference | Ia(t1)−Ie(t1) | Ia(t2)−Ie(t2) | Ia(t3)−Ie(t3) | ... | Ia(tN)−Ie(tN) |
| Temperature difference | Ta(t1)−Te(t1) | Ta(t2)−Te(t2) | Ta(t3)−Te(t3) | ... | Ta(tN)−Te(tN) |
| Pressure difference | Pa(t1)−Pe(t1) | Pa(t2)−Pe(t2) | Pa(t3)−Pe(t3) | ... | Pa(tN)−Pe(tN) |

Fig. 15

| Time | t1 | t2 | t3 | ... | tN |
|---|---|---|---|---|---|
| Voltage ratio | $\dfrac{Va(t1)}{Ve(t1)}$ | $\dfrac{Va(t2)}{Ve(t2)}$ | $\dfrac{Va(t3)}{Ve(t3)}$ | ... | $\dfrac{Va(tN)}{Ve(tN)}$ |
| Current ratio | $\dfrac{Ia(t1)}{Ie(t1)}$ | $\dfrac{Ia(t2)}{Ie(t2)}$ | $\dfrac{Ia(t3)}{Ie(t3)}$ | ... | $\dfrac{Ia(tN)}{Ie(tN)}$ |
| Temperature ratio | $\dfrac{Ta(t1)}{Te(t1)}$ | $\dfrac{Ta(t2)}{Te(t2)}$ | $\dfrac{Ta(t3)}{Te(t3)}$ | ... | $\dfrac{Ta(tN)}{Te(tN)}$ |
| Pressure ratio | $\dfrac{Pa(t1)}{Pe(t1)}$ | $\dfrac{Pa(t2)}{Pe(t2)}$ | $\dfrac{Pa(t3)}{Pe(t3)}$ | ... | $\dfrac{Pa(tN)}{Pe(tN)}$ |

Fig. 21

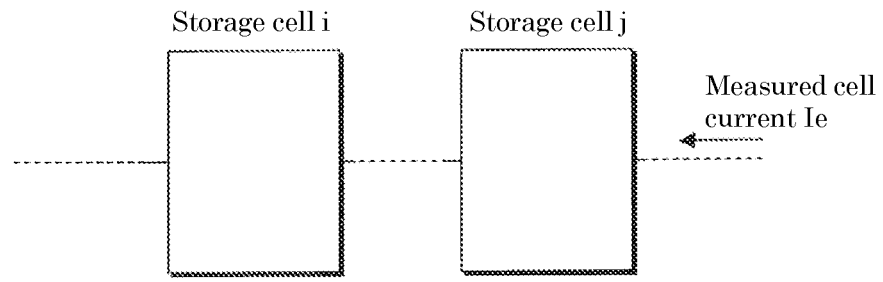

| Measured cell voltage Vei | Measured cell voltage Vej | Measured inter-cell voltage difference ΔV |
|---|---|---|
| Predicted cell voltage Vci | Predicted cell voltage Vcj | |
| Voltage difference between measured and predicted values ΔVeci | Voltage difference between measured and predicted values ΔVecj | |

| Measured cell temperature Tei | Measured cell temperature Tej | Measured inter-cell temperature difference ΔT |
|---|---|---|
| Predicted cell temperature Tci | Predicted cell temperature Tcj | |
| Temperature difference between measured and predicted values ΔTeci | Temperature difference between measured and predicted values ΔTecj | |

Fig. 24

| NO. | Measured cell current $I_e$ | Measured inter-cell voltage difference $\Delta V$ | Difference between measured cell temperatures $\Delta T$ | Voltage difference between measured and predicted values $\Delta V_{ec}$ | Temperature difference between measured and predicted values $T_{ec}$ | Abnormality factor | Operation support information |
|---|---|---|---|---|---|---|---|
| 1 | Below threshold | Below threshold | Threshold or more | Below threshold | Below threshold | Within expectation (No abnormality) | Continue operation in present situation |
| 2 | Below threshold | Below threshold | Threshold or more | Threshold or more | Below threshold | Environmental abnormality | Adjust air conditioning |
| 3 | Threshold or more | Threshold or more | Threshold or more | Below threshold | Below threshold | Within assumption (No abnormality) | Continue operation in present situation |
| 4 | Threshold or more | Threshold or more | Below threshold | Below threshold | Threshold or more | Abnormality of energy storage device | Reduce load or exchange energy storage device |

ABNORMALITY FACTOR DETERMINATION APPARATUS, DEGRADATION DETERMINATION APPARATUS, COMPUTER PROGRAM, DEGRADATION DETERMINING METHOD, AND ABNORMALITY FACTOR DETERMINING METHOD

CROSS REFERENCE TO RELATED APPLICATIONS

This application is a national stage application, filed under 35 U.S.C. § 371, of International Application No. PCT/JP2019/010542, filed Mar. 14, 2019, which international application claims priority to and the benefit of Japanese Application No. 2018-053015, filed Mar. 20, 2018; the contents of both of which as are hereby incorporated by reference in their entireties.

BACKGROUND

Technical Field

The present invention relates to an abnormality factor determination apparatus, a degradation determination apparatus, a computer program, a degradation determining method, and an abnormality factor determining method.

Description of Related Art

An energy storage device has been widely used in an uninterruptible power supply, a DC or AC power supply included in a stabilized power supply, and the like. In addition, the use of energy storage devices in large-scale systems that store renewable energy or electric power generated by existing power generating systems is expanding.

An energy storage module has a configuration in which energy storage cells are connected in series. It is known that degradation of an energy storage cell progresses by repeating charge and discharge. Patent Document JP-A-2008-232758 discloses a technique of detecting a state of charge (SOC) of a secondary battery for a vehicle by inputting a detected value of a state quantity of the secondary battery to a learned neural network unit.

BRIEF SUMMARY

It is considered that charge-discharge behavior and a rate of degradation of an energy storage device installed in a mobile body or facility are different depending on environmental states such as installation conditions of the energy storage device and ambient temperature. When the state quantity of the energy storage device is input into the learned neural network unit and whether the energy storage device has been degraded earlier than assumed is determined, it is not possible to distinguish whether the energy storage device has actually been degraded or has been erroneously determined to be degraded despite being normal due to an environmental difference.

It is an object of the present invention to provide an abnormality factor determination apparatus, a degradation determination apparatus, a computer program, an abnormality factor determining method, and a degradation determining method, which determine an abnormality factor relating to an energy storage system including a plurality of energy storage devices.

An abnormality factor determination apparatus, which determines presence or absence of an abnormality factor relating to an energy storage system including a plurality of energy storage devices, is provided with: a measured value acquisition unit that acquires measured values including electric values and temperature values of the plurality of energy storage devices; a predicted value acquisition unit that acquires predicted values including electric values and temperature values of the plurality of energy storage devices; and a determination unit that determines presence or absence of an abnormality factor relating to the energy storage system based on each of the measured values acquired by the measured value acquisition unit and each of the predicted values acquired by the predicted value acquisition unit.

A computer program, which causes a computer to determine presence or absence of an abnormality factor relating to an energy storage system including a plurality of energy storage devices, causes the computer to perform processing of acquiring measured values that include electric values and temperature values of the plurality of energy storage devices, processing of acquiring predicted values that include electric values and temperature values of the plurality of energy storage devices, and processing of determining presence or absence of an abnormality factor relating to the energy storage system based on each of the acquired measured values and the acquired predicted values.

An abnormality factor determining method, which determines presence or absence of an abnormality factor relating to an energy storage system including a plurality of energy storage devices, includes: acquiring measured values that include electric values and temperature values of the plurality of energy storage devices; acquiring predicted values that include electric values and temperature values of the plurality of energy storage devices; and determining presence or absence of an abnormality factor relating to the energy storage system based on each of the acquired measured values and the acquired predicted values.

The measured value acquisition unit acquires measured values including electric values (e.g., current values and voltage values) and temperature values of a plurality of energy storage devices. The measured value can be acquired from sensors (current sensor, voltage sensor, temperature sensor) of the plurality of energy storage devices included in the energy storage system. The frequency of acquisition of the measured value can be appropriately determined in accordance with the operation state of the energy storage system, and the like. For example, in an operation state where a load fluctuation is relatively large, the frequency of acquiring the measured value can be increased (e.g., five minutes every hour). Further, in an operation state where the load fluctuation is relatively small, the frequency of acquiring the measured value can be reduced (e.g., five minutes every six hours).

The predicted value acquisition unit acquires predicted values including electric values (e.g., voltage values) and temperature values of a plurality of energy storage devices. The predicted value is not a value actually measured by the sensor, but a value assumed in advance in accordance with environmental states such as installation conditions of the plurality of energy storage devices and ambient temperature, and means a calculated value or an estimated value, and means a calculated value or an estimated value.

The determination unit determines the presence or absence of an abnormality factor relating to the energy storage system based on the acquired measured value and predicted value. Based on the measured current values flowing through the plurality of energy storage devices, it can be determined whether the load is heavy or light, or whether the load fluctuation is large or small. The voltage difference between the required energy storage devices can be obtained based on the measured value of the voltage of each of the plurality of energy storage devices. Further, the temperature difference between the required energy storage devices can be obtained based on the measured values of the temperatures of the plurality of energy storage devices. The determination unit can determine the presence or absence of an abnormality factor (e.g., the abnormality of the energy storage device (degradation earlier than assumed) or the abnormality of the environment of the energy storage device) by taking into consideration the measured values of the voltage difference and the temperature difference, the difference between the measured value and the predicted value, and the like.

The abnormality factor determination apparatus may include a provision unit that provides operation support information of the energy storage system based on a result of the determination in the determination unit.

The provision unit provides the operation support information of the energy storage system based on a result of the determination in the determination unit. For example, when it is determined that the energy storage device is abnormal, the provision unit can provide information such as load reduction and replacement of the energy storage device. Further, when it is determined that the environment is abnormal, the provision unit can provide information such as adjustment of air conditioning (e.g., lowering the temperature, etc.) and can provide operation support information for supporting the optimum operation of the energy storage system in accordance with the abnormality factor.

The abnormality factor determination apparatus is provided with: a first calculation unit that calculates a measured voltage difference and a measured temperature difference between required energy storage devices based on the measured values acquired by the measured value acquisition unit; and a second calculation unit that calculates a difference between a measured value and a predicted value with respect to each of a voltage and a temperature of one of the required energy storage devices based on the measured values acquired by the measured value acquisition unit and the predicted values acquired by the predicted value acquisition unit. The determination unit may determine the presence or absence of the abnormality factor based on the measured current value acquired by the measured value acquisition unit, the measured voltage difference and the measured temperature difference calculated by the first calculation unit, and the difference between the measured value and the predicted value calculated by the second calculation unit.

The first calculation unit calculates a measured voltage difference and a measured temperature difference between required energy storage devices based on the measured values acquired by the measured value acquisition unit.

The second calculation unit calculates the difference between the measured value and the predicted value with respect to each of the voltage and temperature of one of the required energy storage devices based on the measured value acquired by the measured value acquisition unit and the predicted value acquired by the predicted value acquisition unit.

The determination unit determines the presence or absence of an abnormality factor based on the measured current value acquired by the measured value acquisition unit, the measured voltage difference and the measured temperature difference calculated by the first calculation unit, and the difference between the measured value and the predicted value calculated by the second calculation unit. For example, when the measured current value and the measured voltage difference between the energy storage devices are large and the difference between the measured value and the predicted value is also large, it can be determined that the one storage device is abnormal. On the other hand, when the measured current value and the measured voltage difference between the energy storage devices are large, but the difference between the measured value and the predicted value is small, it can be determined that the state is within assumption (not abnormal) due to, for example, the differences in the arrangement and installation conditions between the energy storage devices in the energy storage system, deviations in SOC between the energy storage devices, or the like.

When the measured current value is small, the measured temperature difference between the energy storage devices is large, and the difference between the measured value and the predicted value is also large, it can be determined that the environment is abnormal. On the other hand, when the measured current value is small and the measured temperature difference between the energy storage devices is large, but the difference between the measured value and the predicted value is small, it can be determined that the state is within assumption (not abnormal) due to the differences in the arrangement and installation conditions between the energy storage devices in the energy storage system, or the like.

In the abnormality factor determination apparatus, the determination unit may determine whether the abnormality factor is the abnormality of the energy storage device or the abnormality of an environment of the energy storage device.

The determination unit determines whether the abnormality is the abnormality of the energy storage device or the abnormality of the environment of the energy storage device as the abnormality factor. The abnormality of the energy storage device includes, for example, a case where it is determined that the energy storage device deteriorates earlier than assumed. Further, since the abnormality of the energy storage device and the abnormality of the environment can be discriminated and determined, it is possible to prevent erroneous determination of the abnormality of the energy storage device.

The abnormality factor determination apparatus is provided with a learning apparatus caused to learn based on learning data having, as input data, the measured current values of the plurality of energy storage devices, the measured voltage difference and the measured temperature difference between the required energy storage devices, and the difference between the measured value and the predicted value with respect to each of the voltage and the temperature of one of the required energy storage devices, the learning data having the abnormality factor as output data. The determination unit may input to the learning unit the measured current value acquired by the measured value acquisition unit, the measured voltage difference and the measured temperature difference calculated by the first calculation unit, and the difference between the measured value and the predicted value calculated by the second calculation unit, and determines the presence or absence of an abnormality factor.

The learning apparatus has learned based on learning data having, as input data, the measured current values of the plurality of energy storage devices, the measured voltage difference and the measured temperature difference between the required energy storage devices, and the difference between the measured value and the predicted value with respect to each of the voltage and the temperature of one of the required energy storage devices, the learning data having the abnormality factor as output data.

The learning apparatus has learned so as to output the abnormality of the one storage device when, for example, the measured current value and the measured voltage difference between the energy storage devices are large and the difference between the measured value and the predicted value is also large. The learning apparatus has learned so as to output a state within assumption (not abnormal) when the measured current value and the measured voltage difference between the energy storage devices are large and the difference between the measured value and the predicted value is small.

The learning apparatus has learned so as to output that the environment is abnormal when the measured current value is small, the measured temperature difference between the energy storage devices is large, and the difference between the measured value and the predicted value is also large. The learning apparatus has learned so as to output that the state is within assumption (not abnormal) when the measured current value is small, the measured temperature difference between the energy storage devices is large, and the difference between the measured value and the predicted value is small.

The determination unit input into the learning apparatus the measured current value acquired by the measured value acquisition unit, the measured voltage difference and the measured temperature difference calculated by the first calculation unit, and the difference between the measured value and the predicted value calculated by the second calculation unit, and determines the presence or absence of an abnormality factor. It is thereby possible to determine an abnormality factor (e.g., the abnormality of the energy storage device (degradation earlier than assumed, or the like) or the abnormality of the environment of the energy storage device). Further, since the abnormality of the energy storage device and the abnormality of the environment can be discriminated and determined, it is possible to prevent erroneous determination of the abnormality of the energy storage device.

A degradation determination apparatus for determining degradation of an energy storage device is provided with: a measured data acquisition unit that acquires measured time-series data including a measured electric value and a measured temperature value of the energy storage device; a predicted data acquisition unit that acquires predicted time-series data including a predicted electric value and a predicted temperature value of the energy storage device; and a learning processing unit that causes a learning model to learn based on learning data having the measured time-series data and the predicted time-series data as input data and having determination of degradation of the energy storage device as output data.

A computer program, which causes a computer to determine degradation of an energy storage device, causes the computer to perform processing of acquiring measured time-series data that includes a measured electric value and a measured temperature value of the energy storage device, processing of acquiring predicted time-series data that includes a predicted electric value and a predicted temperature value of the energy storage device, and processing of causing a learning model to learn based on learning data having the measured time-series data and the predicted time-series data as input data and having determination of degradation of the energy storage device as output data.

A degradation determining method for determining degradation of an energy storage device includes: acquiring measured time-series data that includes a measured electric value and a measured temperature value of the energy storage device; acquiring predicted time-series data that includes a predicted electric value and a predicted temperature value of the energy storage device; and causing a learning model to learn based on learning data having the measured time-series data and the predicted time-series data as input data and determination of degradation of the energy storage device as output data.

The measured data acquisition unit acquires measured time-series data including a measured electric value and a measured temperature value of the energy storage device. The electrical value includes voltage and current. The measured electric value includes, for example, a voltage value measured by the voltage sensor and a current value measured by a current sensor. The measured temperature value is a temperature measured by the temperature sensor.

The predicted data acquisition unit acquires predicted time-series data including a predicted electric value and a predicted temperature value of the energy storage device. The predicted electric value or the predicted temperature value is not a value actually measured by the sensor, but a value assumed in advance in accordance with environmental states such as installation conditions of the energy storage device and ambient temperature and means a calculated value or an estimated value.

The learning processing unit causes a learning model to learn based on learning data having the measured time-series data and the predicted time-series data as input data and determination of degradation of the energy storage device as output data. The learning model learns not only the measured time-series data including the measured electric value and the measured temperature value of the energy storage device but also predicted time-series data including the predicted electric value and the predicted temperature value of the energy storage device. That is, it is possible to learn how the measured electric value and the measured temperature value of the energy storage device change and how the predicted electric value and the predicted temperature value of the energy storage device change to determine whether the energy storage device is normal or has been degraded. Since the predicted time-series data is data that is assumed in accordance with environmental states such as installation conditions of the energy storage device and ambient temperature, the learning model can learn the charge-discharge behavior of the energy storage device due to the environmental difference.

Hence, it is possible to generate a learning-completed learning model that can accurately determine the degradation of the energy storage device even when there are environmental differences such as installation conditions of the energy storage device and ambient temperature.

A degradation determination apparatus for determining degradation of an energy storage device is provided with: a measured data acquisition unit that acquires measured time-series data including a measured electric value and a measured temperature value of the energy storage device; a predicted data acquisition unit that acquires predicted time-series data including a predicted electric value and a predicted temperature value of the energy storage device; and a learning-completed learning model that uses the measured time-series data and the predicted time-series data as input data to output determination of degradation of the energy storage device.

A computer program, which causes a computer to determine degradation of an energy storage device, causes the computer to perform processing of acquiring measured time-series data that includes a measured electric value and a measured temperature value of the energy storage device, processing of acquiring predicted time-series data that includes a predicted electric value and a predicted temperature value of the energy storage device, and processing of inputting the measured time-series data and the predicted time-series data into a learning-completed learning model to determine degradation of the energy storage device.

A degradation determining method for determining degradation of an energy storage device includes: acquiring measured time-series data that includes a measured electric value and a measured temperature value of the energy storage device; acquiring predicted time-series data that includes a predicted electric value and a predicted temperature value of the energy storage device; and inputting the measured time-series data and the predicted time-series data into a learning-completed learning model to determine degradation of the energy storage device.

The learning-completed learning model uses the measured time-series data and the predicted time-series data as input data to output the determination of the deterioration of the energy storage device. The learning-completed learning model has learned how the measured electric value and the measured temperature value of the energy storage device change and how the predicted electric value and the predicted temperature value of the energy storage device change to determine whether the energy storage device is normal or has been degraded. Since the predicted time-series data is data that is assumed in accordance with environmental states such as installation conditions of the energy storage device and ambient temperature, the learning-completed learning model has learned the charge-discharge behavior of the energy storage device due to the environmental difference.

Hence, it is possible to accurately determine the degradation of the energy storage device even when there are environmental differences such as installation conditions of the energy storage device and ambient temperature.

In the degradation determination apparatus, the learning processing unit may cause the learning model to learn based on learning data having, as input data, respective pieces of time-series data of a difference or a ratio between the measured electric value and the predicted electric value and a difference or a ratio between the measured temperature value and the predicted temperature value.

The learning processing unit causes the learning model to learn based on learning data having, as input data, respective pieces of time-series data of a difference or a ratio between the measured electric value and the predicted electric value and a difference or a ratio between the measured temperature value and the predicted temperature value.

The learning model can learn how the difference or the ratio between the measured electric value and the predicted electric value changes to determine whether the energy storage device is normal or has been degraded. The learning model can learn how the difference or the ratio between the measured temperature value and the predicted temperature value changes to determine whether the energy storage device is normal or has been degraded. Thus, the learning model can learn the charge-discharge behavior of the energy storage device due to the environmental difference.

In the degradation determination apparatus, the measured data acquisition unit may acquire measured time-series data including a measured voltage value of the energy storage device, the predicted data acquisition unit may acquire predicted time-series data including a predicted voltage value of the energy storage device, and the learning processing unit may causes the learning model to learn based on learning data having the measured time-series data that includes the measured voltage value and the predicted time-series data that includes the predicted voltage value as input data.

The measured data acquisition unit acquires measured time-series data including a measured voltage value of the energy storage device. The predicted data acquisition unit acquires predicted time-series data including a predicted voltage value of the energy storage device. The learning processing unit causes a learning model to learn based on learning data having the measured time-series data that includes the measured voltage value and the predicted time-series data that includes the predicted voltage value as input data.

The learning model can learn how the measured voltage value and the predicted voltage value changes to determine whether the energy storage device is normal or has been degraded. Thus, the learning model can learn whether the energy storage device is normal or has been degraded in accordance with an assumed voltage difference.

In the degradation determination apparatus, the measured data acquisition unit may acquire measured time-series data including a measured current value of the energy storage device, the predicted data acquisition unit may acquire predicted time-series data including a predicted current value of the energy storage device, and the learning processing unit may cause the learning model to learn based on learning data having the measured time-series data that includes the measured current value and the predicted time-series data that includes the predicted current value as input data.

The measured data acquisition unit acquires measured time-series data including a measured current value of the energy storage device. The predicted data acquisition unit acquires predicted time-series data including a predicted current value of the energy storage device. The learning processing unit causes the learning model to learn based on learning data having the measured time-series data that includes the measured current value and the predicted time-series data that includes the predicted current value as input data.

The learning model can learn how the measured current value and the predicted current value change to determine whether the energy storage device is normal or has been degraded. Hence, the learning model can learn whether the energy storage device is normal or has been degraded in accordance with the assumed current difference.

In the degradation determination apparatus, the measured data acquisition unit acquires measured time-series data including a difference or a ratio between a measured electric value of each of the plurality of energy storage cells forming the energy storage module and an average value of the measured electric values of the plurality of energy storage cells, and the learning processing unit causes the learning model to learn based on learning data having measured time-series data that includes the difference or the ratio as input data.

The measured data acquisition unit acquires measured time-series data including a difference or a ratio between a measured electric value of each of the plurality of energy storage cells forming the energy storage module and an average value of the measured electric values of the plurality of energy storage cells. That is, the measured time-series data including the difference or the ratio between the average value acquired by averaging the actual measured electric values of the plurality of energy storage cells and the actual measured electric values of the plurality of energy storage cells are acquired.

The learning processing unit causes the learning model to learn based on learning data having measured time-series data that includes the difference or the ratio as input data. Thus, the learning model can learn how the difference or the ratio between the average value obtained by averaging the measured electric values of the plurality of energy storage cells and the measured electric values of the plurality of energy storage cells changes to determine whether the energy storage device is normal or has been degraded. The learning model can learn whether the energy storage device is normal or has been degraded in accordance with the measured electric value between the energy storage cells.

In the degradation determination apparatus, the predicted data acquisition unit acquires predicted time-series data including a difference or a ratio between a predicted electric value of each of the plurality of energy storage cells forming the energy storage module and an average value of the predicted electric values of the plurality of energy storage cells, and the learning processing unit causes the learning model to learn based on learning data having predicted time-series data that includes the difference or the ratio as input data.

The predicted data acquisition unit acquires predicted time-series data including a difference or a ratio between a predicted electric value of each of the plurality of energy storage cells forming the energy storage module and an average value of the predicted electric values of the plurality of energy storage cells. That is, the predicted data acquisition unit acquires the measured time-series data including the difference or the ratio between the average value acquired by averaging the predicted electric values of the plurality of energy storage cells and the predicted electric value of each of the plurality of energy storage cells.

The learning processing unit causes the learning model to learn based on learning data having the predicted time-series data that includes the difference or the ratio as input data. Hence the learning model can learn how the difference or the ratio between the average value obtained by averaging the predicted electric values of the plurality of energy storage cells and the predicted electric values of the plurality of energy storage cells changes to determine whether the energy storage device is normal or has been degraded. Thus, the learning model can learn whether the energy storage device is normal or has been degraded in accordance with the prior environmental difference between the energy storage cells.

In the degradation determination apparatus, the predicted data acquisition unit acquires predicted time-series data including a difference or a ratio between a predicted temperature value of each of the plurality of energy storage cells forming the energy storage module and an average value of the predicted temperature values of the plurality of energy storage cells, and the learning processing unit causes the learning model to learn based on learning data having predicted time-series data that includes the difference or the ratio as input data.

The predicted data acquisition unit acquires predicted time-series data including a difference or a ratio between a predicted temperature value of each of the plurality of energy storage cells forming the energy storage module and an average value of the predicted temperature values of the plurality of energy storage cells. That is, the predicted time-series data including the difference or the ratio between the average value acquired by averaging the predicted temperature values of the plurality of energy storage cells and the predicted temperature values of the plurality of energy storage cells. The predicted temperature value of each of the plurality of energy storage cells can be obtained based on the predicted current value flowing in the energy storage cell, the arrangement status of the energy storage cells in the energy storage module, the predicted temperature value of the energy storage module, and the like.

The learning processing unit causes the learning model to learn based on learning data having the predicted time-series data that includes the difference or the ratio as input data. Hence the learning model can learn how the difference or the ratio between the average value obtained by averaging the predicted temperature values of the plurality of energy storage cells and the predicted temperature values of the plurality of energy storage cells changes to determine whether the energy storage device is normal or has been degraded. Thus, the learning model can learn whether the energy storage device is normal or has been degraded in accordance with the prior environmental difference between the energy storage cells.

In the degradation determination apparatus, the measured data acquisition unit acquires measured time-series data including a measured pressure value of the energy storage device, the predicted data acquisition unit acquires predicted time-series data including a predicted pressure value of the energy storage device, and the learning processing unit causes the learning model to learn based on learning data having time-series data that includes a difference or a ratio between the measured pressure value and the predicted pressure value as input data.

The measured data acquisition unit acquires measured time-series data including a measured pressure value of the energy storage device. The predicted data acquisition unit acquires the predicted time-series data including the predicted pressure value of the energy storage device. The learning processing unit causes the learning model to learn based on learning data having time-series data that includes a difference or a ratio between the measured pressure value and the predicted pressure value as input data.

The learning model can learn how the measured pressure value and the predicted pressure value change to determine whether the energy storage device is normal or has been degraded. Thus, the learning model can learn whether the energy storage device is normal or has been degraded in accordance with the assumed pressure difference.

In the degradation determination apparatus, the learning processing unit causes the learning model to learn based on learning data having presence or absence of an environmental abnormality relating to the energy storage device as output data.

The learning processing unit causes the learning model to learn based on learning data having presence or absence of an environmental abnormality relating to the energy storage device as output data. By causing the learning model to learn the presence or absence of an environmental abnormality, for example, it is possible to learn not only the degradation of the energy storage device but also that there is an environmental abnormality, and also to distinguish and determine the degradation of the energy storage device from the environmental abnormality.

The degradation determination apparatus may determine the degradation of the energy storage device by using a learning-completed learning model caused to learn by the learning processing unit.

The learning processing unit determines the degradation of the energy storage device by using the learning-completed learning model caused to learn by the learning processing unit. Hence, it is possible to accurately determine the degradation of the energy storage device even when there are environmental differences such as installation conditions of the energy storage device and ambient temperature.

With the configuration described above, it is possible to determine an abnormality factor relating to the energy storage system and to provide operation support information that supports the optimum operation of the energy storage system in accordance with the abnormality factor.

BRIEF DESCRIPTION OF THE FIGURES

FIG. 13 is a configuration diagram showing a first example of learning data.

FIG. 14 is a configuration diagram showing a second example of learning data.

FIG. 15 is a configuration diagram showing a third example of learning data.

FIG. 21 is an explanatory diagram showing an example of a relationship between a measured value and a predicted value.

FIG. 24 is an explanatory diagram showing an example of a rule-based model for determining an abnormality factor.

DETAILED DESCRIPTION OF VARIOUS EMBODIMENTS

First Embodiment

Figure 1:
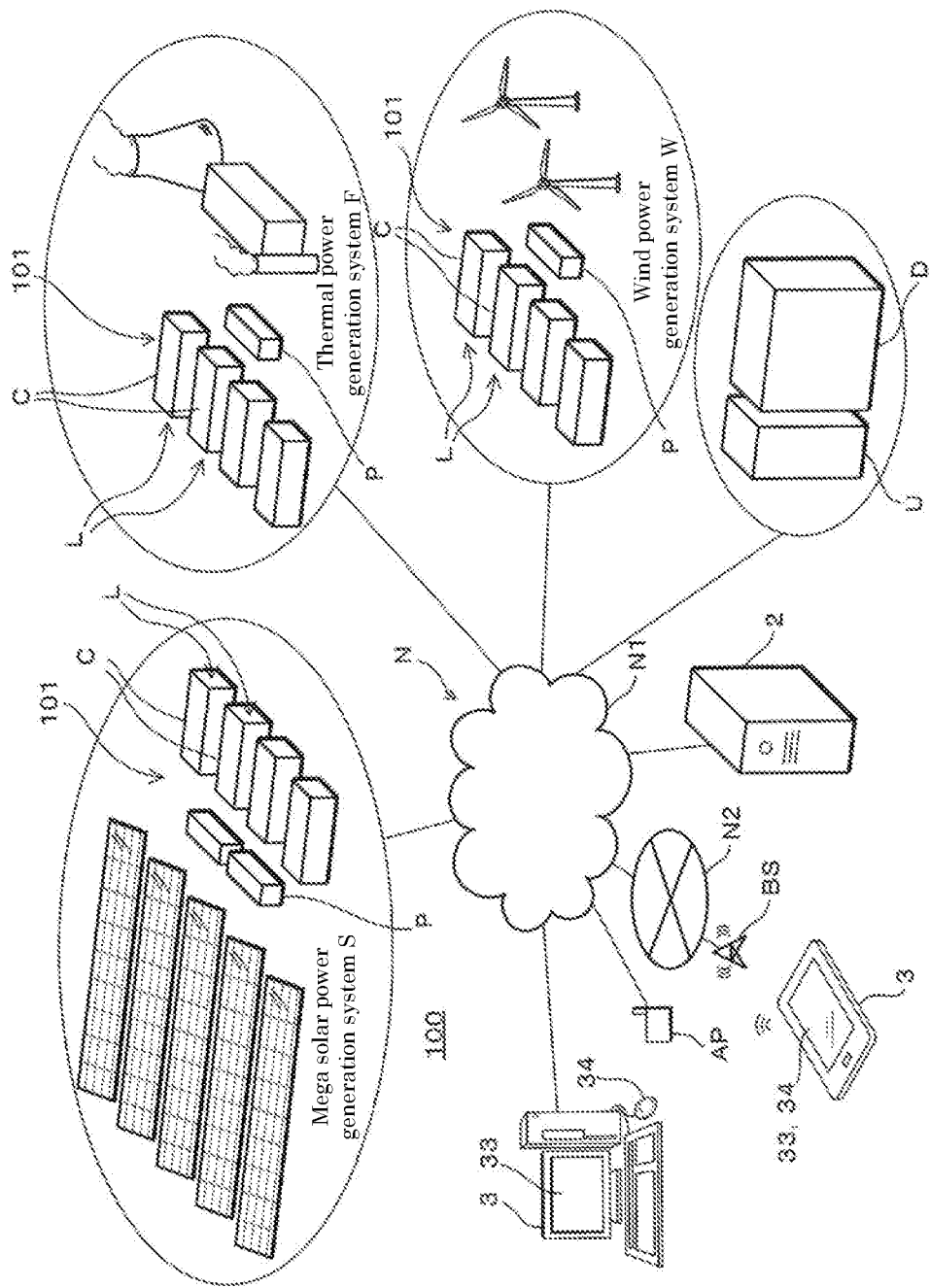
FIG. 1 is a diagram showing an outline of a remote monitoring system of the present embodiment.

A degradation determination apparatus according to the present embodiment will be described below with reference to the drawings. FIG. 1 is a diagram showing an outline of a remote monitoring system 100 of the present embodiment. As shown in FIG. 1, a thermal power generation system F, a mega solar power generation system S, a wind power generation system W, a uninterruptible power supply (UPS) U, a rectifier (d.c. power supply or a.c. power supply) D disposed in a stabilized power supply system for railways, and the like are connected to a network N including a public communication network (e.g., the Internet) N1, a carrier network N2 that achieves wireless communication based on a mobile communication standard, and the like. A communication device 1 to be described later, a server apparatus 2 that collects information from the communication device 1 and serves as a degradation determination apparatus, and a client apparatus 3 that acquires the collected information are connected to the network N.

More specifically, the carrier network N2 includes a base station BS, and the client apparatus 3 can communicate with the server apparatus 2 from the base station BS via the network N. An access point AP is connected to the public communication network N1, and the client apparatus 3 can transmit and receive information to and from the server apparatus 2 via the network N from the access point AP.

A power conditioner (power conditioning system: PCS) P and an energy storage system 101 are attached to a mega solar power generation system S, a thermal power generation system F and a wind power generation system W. The energy storage system 101 is configured by juxtaposing a plurality of containers C each housing an energy storage module group L. The energy storage module group L has a hierarchical structure of, for example, an energy storage module (also called a module) in which a plurality of energy storage cells (also called a cell) are connected in series, a bank in which a plurality of energy storage modules are connected in series, and a domain in which a plurality of banks are connected in parallel. The energy storage device is preferably rechargeable, such as a secondary battery like a lead-acid battery or a lithium ion battery, or a capacitor. A part of the energy storage device may be a primary battery that is not rechargeable.

Figure 2:
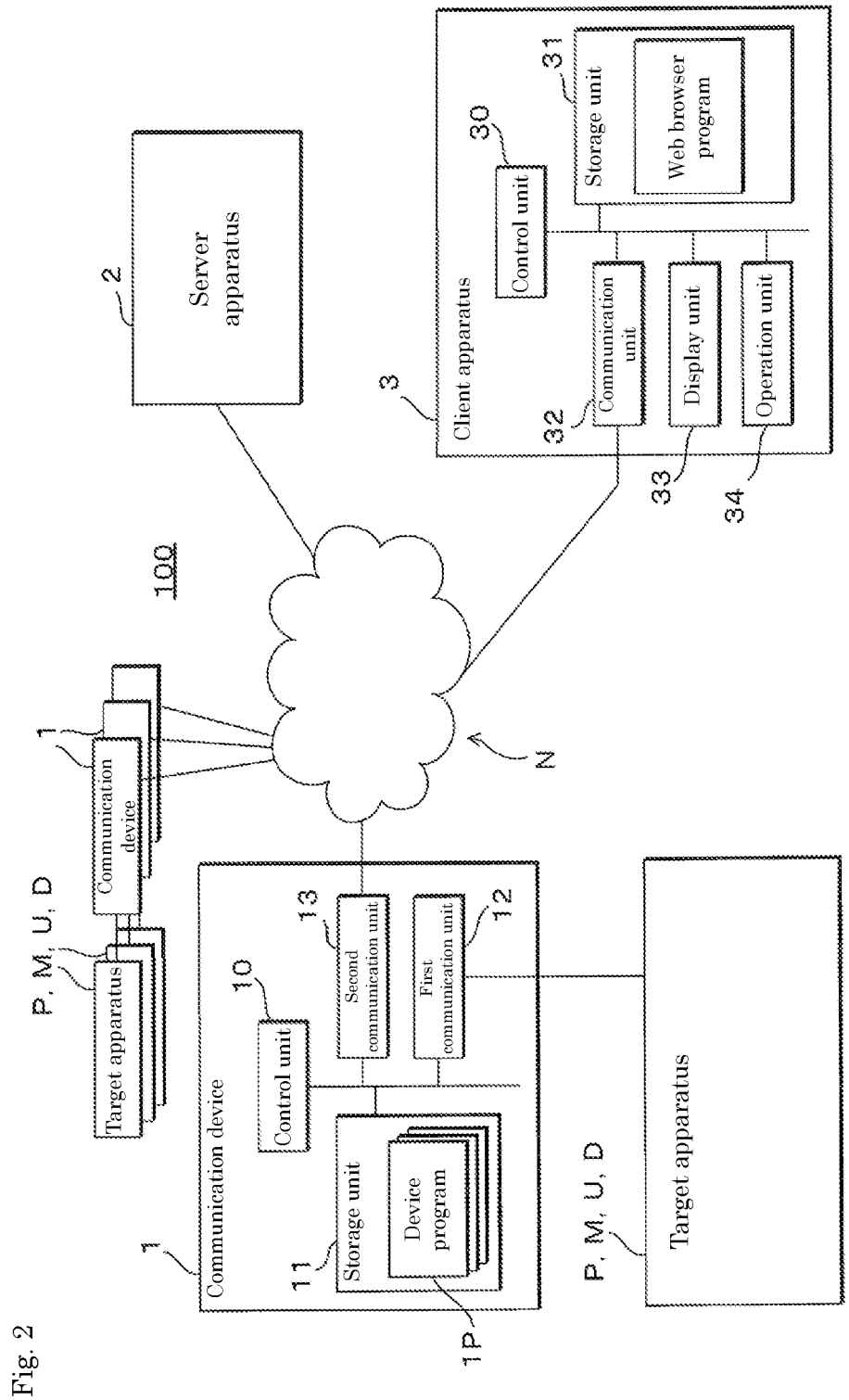
FIG. 2 is a block diagram showing an example of the configuration of the remote monitoring system.

FIG. 2 is a block diagram showing an example of the configuration of the remote monitoring system 100. The remote monitoring system 100 includes the communication device 1, a server apparatus 2, a client apparatus 3, and the like.

As shown in FIG. 2, the communication device 1 is connected to the network N and is also connected to the target apparatuses P, U, D, M. The target apparatuses P, U, D, M include a power conditioner P, an uninterruptible power supply U, a rectifier D, and a management apparatus M to be described later.

In the remote monitoring system 100, the state (e.g., voltage, current, temperature, state of charge (SOC)) of the energy storage module (energy storage cell) in the energy storage system 101 is monitored and collected by using the communication device 1 connected to each of the target apparatuses P, U, D, M. The remote monitoring system 100 presents the detected state (including a state of degradation) of the energy storage cell so that a user or an operator (a person in charge of maintenance) can confirm the detected state.

The communication device 1 includes a control unit 10, a storage unit 11, a first communication unit 12, and a second communication unit 13. The control unit 10 is made of a central processing unit (CPU) or the like, and controls the entire communication device 1 by using built-in memories such as read-only memory (ROM) and random-access memory (RAM).

The storage unit 11 may be a nonvolatile memory such as a flash memory. The storage unit 11 stores a device program 1P to be read and executed by the control unit 10. The storage unit 11 stores information such as information collected by the processing of the control unit 10 and event logs.

The first communication unit 12 is a communication interface for achieving communication with the target apparatuses P, U, D, M and can use, for example, a serial communication interface such as RS-232 C or RS-485.

The second communication unit 13 is an interface for achieving communication via the network N and uses, for example, a communication interface such as an Ethernet (registered trademark) or a wireless communication antenna. The control unit 10 can communicate with the server apparatus 2 via the second communication unit 13.

The client apparatus 3 may be a computer used by the operator such as a manager of the energy storage system 101 of the power generation systems S, F or a person in charge of maintenance of the target apparatuses P, U, D, M. The client apparatus 3 may be a desktop type or a laptop type personal computer or may be a smartphone or a tablet type communication terminal. The client apparatus 3 includes a control unit 30, a storage unit 31, a communication unit 32, a display unit 33, and an operation unit 34.

The control unit 30 is a processor using a CPU. A control unit 30 causes a display unit 33 to display a Web page provided by the server apparatus 2 or the communication device 1 based on a Web browser program stored in a storage unit 31.

The storage unit 31 uses a nonvolatile memory such as a hard disk or a flash memory. The storage unit 31 stores various programs including a Web browser program.

The communication unit 32 can use a communication device such as a network card for wired communication, a wireless communication device for mobile communication connected to a base station BS (see FIG. 1), or a wireless communication device corresponding to connection to the access point AP. The control unit 30 enables communication connection or transmission and reception of information between the server apparatus 2 or the communication device 1 via the network N by the communication unit 32

The display unit 33 may be a liquid crystal display, an organic electroluminescence (EL) display, or the like. The display unit 33 can display an image of a Web page provided by the server apparatus 2 by processing based on the Web browser program of the control unit 30.

The operation unit 34 is a user interface, such as a keyboard and a pointing device, capable of input and output with the control unit 30 or a voice input unit. A touch panel of the display unit 33 or a physical button provided in the housing may be used for the operation unit 34. The operation unit 34 notifies information of operation by the user to the control unit 20.

The configuration of the server apparatus 2 will be described later.

Figure 3:
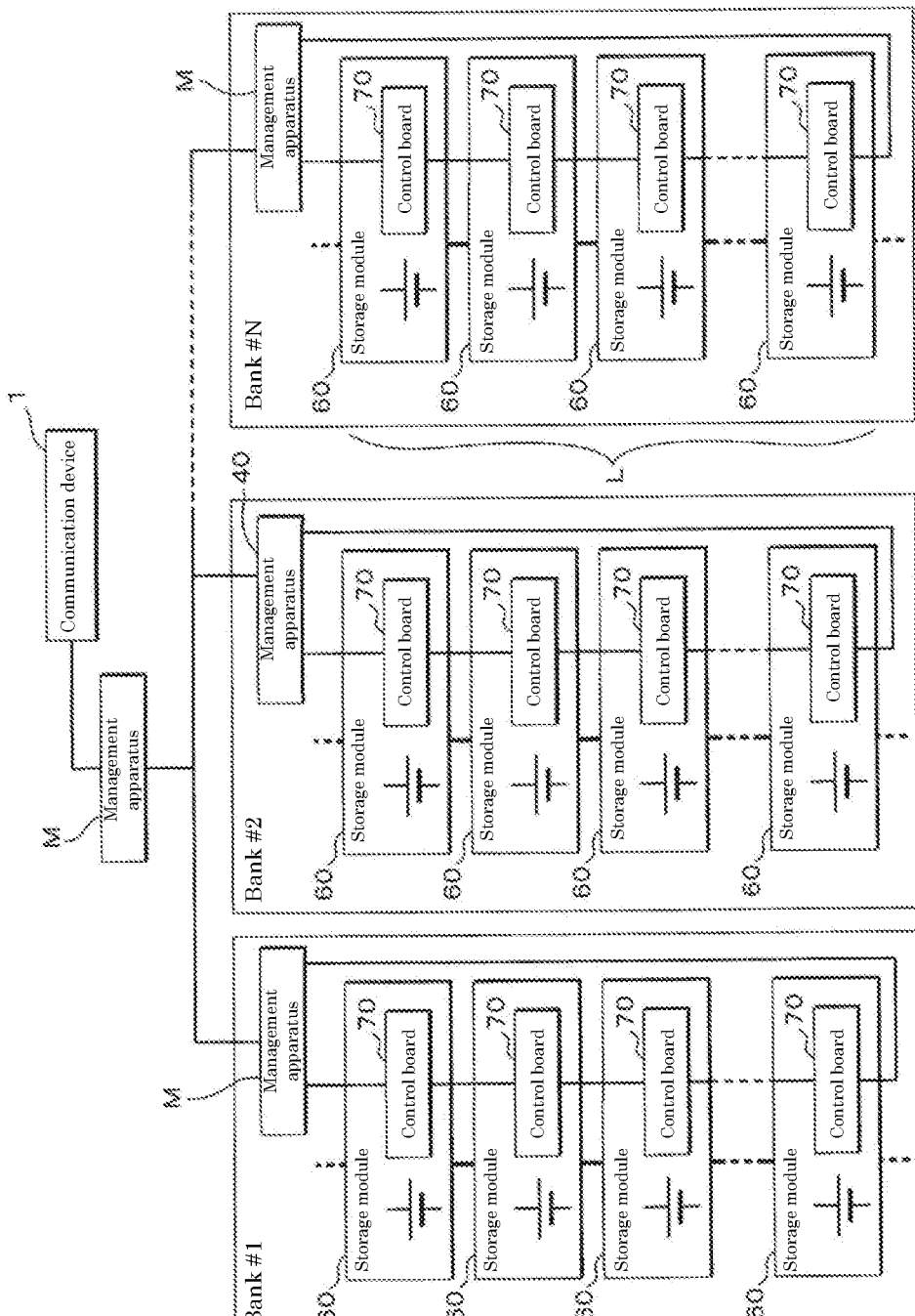
FIG. 3 is a diagram showing an example of a connection mode of a communication device.

FIG. 3 is a diagram showing an example of the connection mode of the communication device 1. As shown in FIG. 3, the communication device 1 is connected to the management apparatus M. Management apparatuses M provided in banks #1 to #N, respectively, are connected to the management apparatus M. Note that the communication device 1 may be a terminal apparatus (measurement monitor) that communicates with the management apparatuses M provided in each of the banks #1 to #N to receive information on the energy storage devices, or may be a network card type communication device that can be connected to a power-supply-related apparatus.

Each of the banks #1 to #N includes a plurality of energy storage modules 60, and each energy storage module 60 comprises a control board (cell monitoring unit: CMU) 70. The management apparatus M provided for each bank can communicate with the control board 70 with a communication function built in each energy storage module 60 by serial communication and can transmit and receive information to and from the management apparatus M connected to a communication device 1. The management apparatus M connected to the communication device 1 aggregates information from each management apparatus M of the bank belonging to a domain and outputs the aggregated information to the communication device 1.

Figure 4:
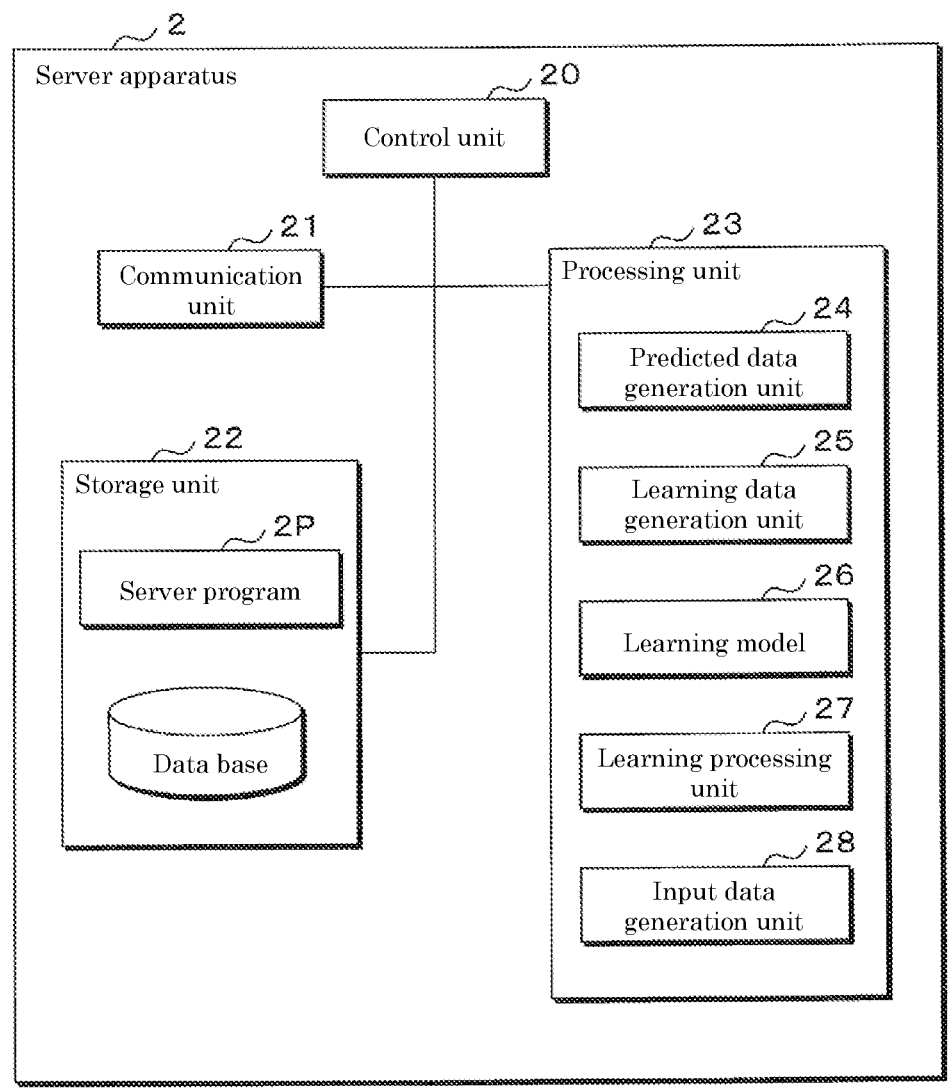
FIG. 4 is a block diagram showing an example of a configuration of a server apparatus.

FIG. 4 is a block diagram showing an example of the configuration of the server apparatus 2. The server apparatus 2 includes a control unit 20, a communication unit 21, a storage unit 22, and a processing unit 23. The processing unit 23 includes a predicted data generation unit 24, a learning data generation unit 25, a learning model 26, a learning processing unit 27, and an input data generation unit 28. The server apparatus 2 may be a single server computer, but is not limited to this, and may be made up of a plurality of server computers.

The control unit 20 can be made of, for example, a CPU, and controls the entire server apparatus 2 by using built-in memories such as ROM and RAM. The control unit 20 executes information processing based on a server program 2P stored in the storage unit 22. The server program 2P includes a Web server program, and the control unit 20 functions as a Web server that performs provision of a Web page to the client apparatus 3, reception of a login to a Web service, and the like. The control unit 20 can also collect information from the communication device 1 as a simple network management protocol) (SNMP) server based on the server program 2P.

The communication unit 21 is a communication device that achieves the communication connection and the transmission and reception of data via the network N. Specifically, the communication unit 21 is a network card corresponding to the network N.

The storage unit 22 may be a nonvolatile memory such as a hard disk or a flash memory. The storage unit 22 stores sensor information (e.g., measured voltage data, measured current data, measured temperature data, and measured pressure data of the energy storage device) that includes the states of the target apparatuses P, U, D, M to be monitored and is collected by the processing of the control unit 20.

The processing unit 23 can acquire sensor information (measured voltage data in time series, measured current data in time series, measured temperature data in time series, and measured pressure data in time series) of the energy storage devices (energy storage modules, energy storage cells) collected in the database of the storage unit 22, by classifying the information into each energy storage device.

The processing unit 23 operates in a learning mode for learning the learning model 26 and in a determination mode for determining the presence or absence of degradation of the energy storage device and an abnormality of the environment (environmental abnormality) in which the energy storage device is installed by using the learning-completed learning model 26.

Figure 5:
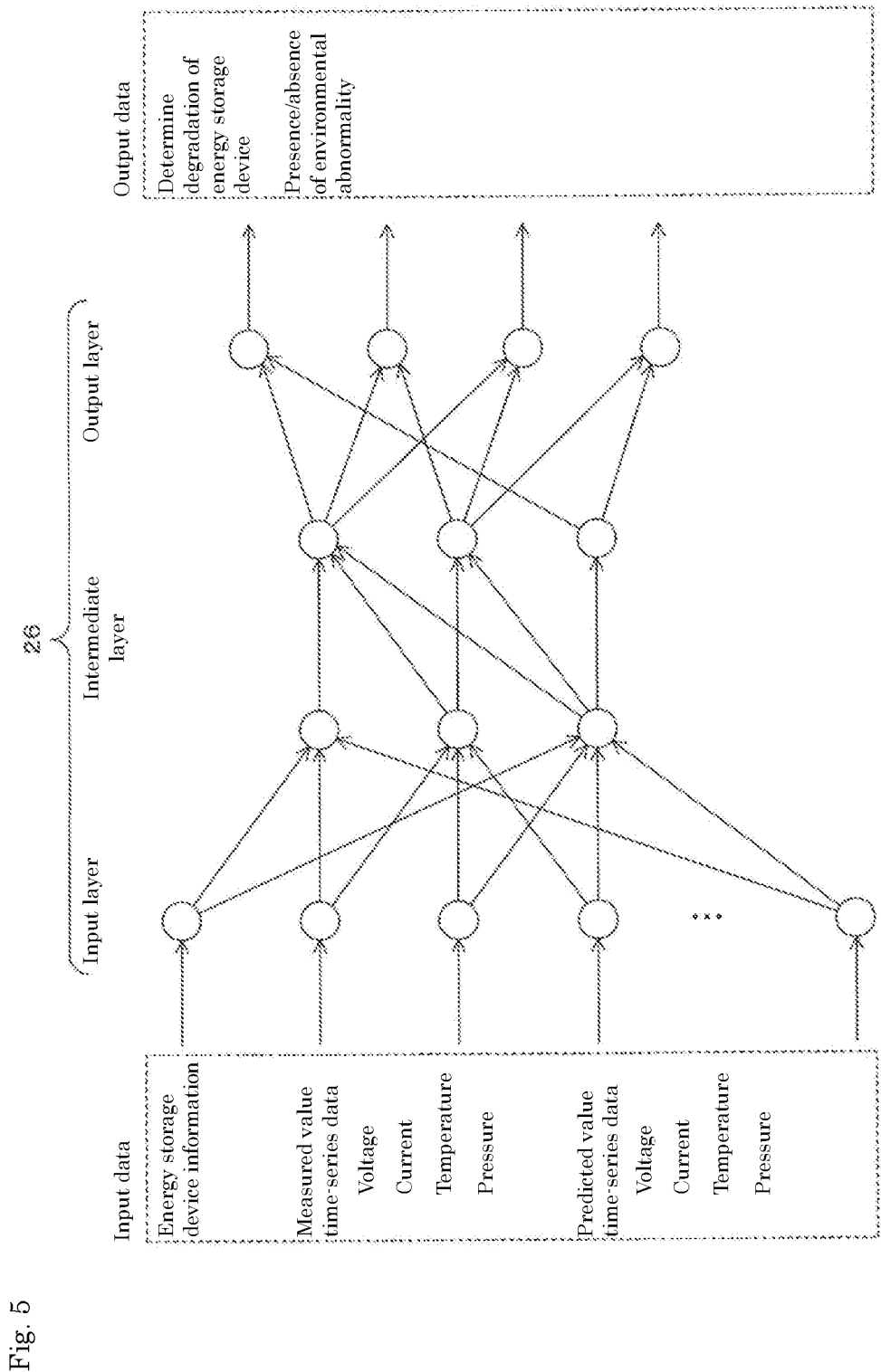
FIG. 5 is a schematic diagram showing an example of a configuration of a learning model.

FIG. 5 is a schematic diagram showing an example of the configuration of the learning model 26. The learning model 26 is a neural network model including deep learning and is made up of an input layer, an output layer, and a plurality of intermediate layers. Although two intermediate layers are shown in FIG. 5 for convenience, the number of intermediate layers is not limited to two but may be three or more.

In the input layer, the output layer, and the intermediate layer, there are one or more nodes (neurons), and the node of each layer is coupled in one direction with a desired weight to each of the nodes existing in the preceding and succeeding layers. A vector having the same number of components as the number of nodes of an input layer is provided as input data of the learning model 26 (input data for learning and input data for determination). The input data includes energy storage device information (SOC, full charge capacity, SOC-OCV (open circuit voltage) curve, internal resistance, etc.), measured value time-series data (voltage, current, temperature, pressure, etc.), predicted value time-series data (voltage, current, temperature, pressure, etc.), and the like. The output data includes determination of degradation of the energy storage device and the presence or absence of an environmental abnormality. Details of these information will be described later.

The data provided to each node of the input layer is input into the first intermediate layer, where the output of the intermediate layer is calculated using weights and activation functions, and the calculated values are provided to the next intermediate layer and are similarly transferred to subsequent layers (lower layer) in sequence until the output of the output layer is obtained in the same manner. Note that all the weights combining the nodes are calculated by a learning algorithm.

The output data can be data in a vector format having components of the same size as the number of nodes (size of the output layer) of the output layer. For example, as shown in FIG. 5, the number of nodes of the output layer can be 4, and the output nodes can be a probability that the energy storage device is in a degraded state, a probability that the energy storage device is normal, a probability that the environment is abnormal, a probability that the environment is normal, and the like.

The learning model 26 and the learning processing unit 27 can be configured, for example, by combining hardware such as a CPU (e.g., multiple processors mounted with a plurality of processor cores, etc.), a graphics processing unit (GPU), a digital signal processor (DSP), a field-programmable gate array (FPGA), and the like. A quantum processor can also be combined. The learning model 26 is not limited to a neural network model but may be other machine learning models.

Figure 6:
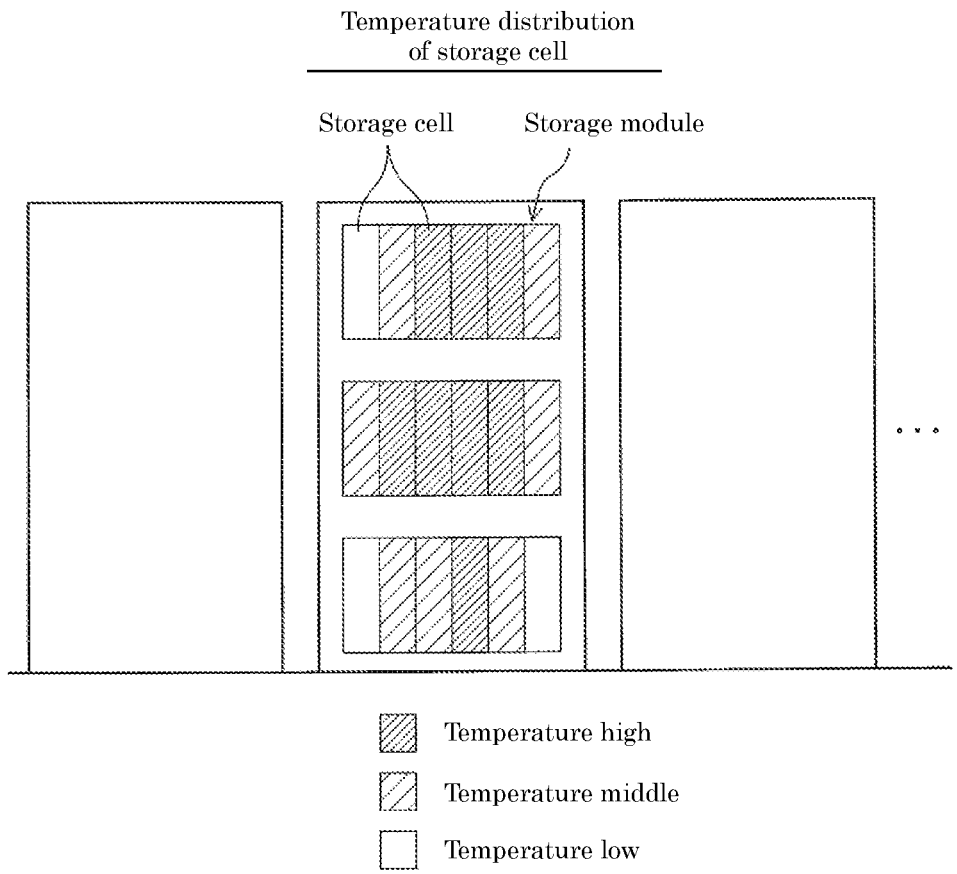
FIG. 6 is a schematic diagram showing an example of a temperature distribution of an energy storage cell in the energy storage module.

FIG. 6 is a schematic diagram showing an example of a temperature distribution of an energy storage cell in the energy storage module. In FIG. 6, for convenience, the temperature distribution is classified into three groups of high (fairly high), medium (somewhat high), and low (usual), but the actual temperature distribution can be expressed in more detail (e.g., in 1-° C. increments). The temperature distribution can be assumed (predicted) in advance based on various environmental factors such as the placement of each energy storage cell in the energy storage module, the value of current flowing through the energy storage module (energy storage cell), the installation conditions of the energy storage module, and the ambient temperature of the energy storage module. In the example of FIG. 6, it can be seen that the temperature of the energy storage cell disposed near the center is higher than that of the energy storage module disposed outside and that the temperature of the upper side of the energy storage module is higher than that of the lower side. As described above, it can be said that the temperature difference between the energy storage cells appears as a result of aggregation of various environmental factors.

Figure 7:
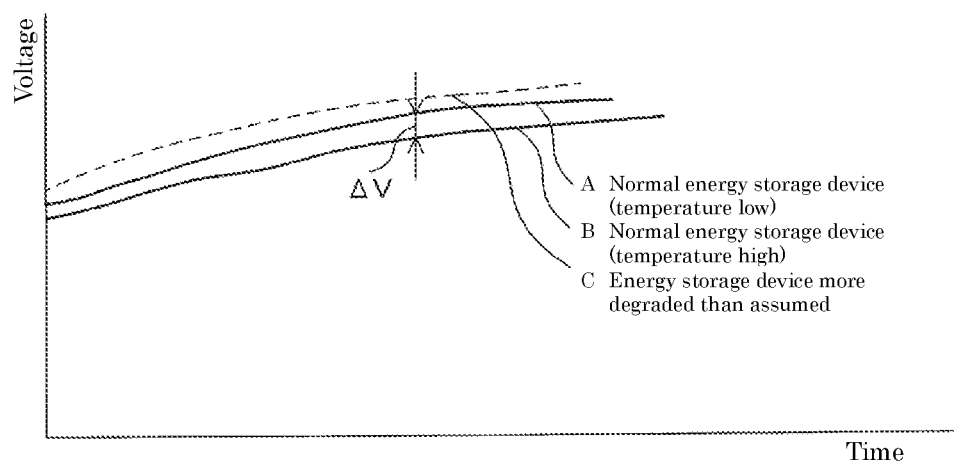
FIG. 7 is a schematic diagram showing an example of a difference in behavior of an energy storage device due to an environmental difference.

FIG. 7 is a schematic diagram showing an example of a difference in the behavior of the energy storage device due to an environmental difference. In FIG. 7, the vertical axis represents the voltage, and the horizontal axis represents the time. The voltage is, for example, a change when the energy storage device is being charged, but the same applies in the case of discharge. In the example of FIG. 7, the environmental difference is a temperature difference. In the figure, a curve indicated by symbol B shows a change in the voltage of a normal energy storage device. If the change in the voltage of the energy storage device of the curve indicated by symbol A is observed without considering the temperature difference, since the voltage is high as compared to the change in the voltage of the normal energy storage device indicated by symbol B, it can be determined that, for example, the internal resistance of the energy storage device has increased and the capacity has decreased, and three is a possibility that the energy storage device of the curve indicated by symbol A is determined to be degraded. In practice, however, the change in the voltage of the energy storage device of the curve indicated by symbol A represents a change at a temperature considerably lower than the temperature (high: ordinary) of the normal energy storage device indicated by symbol B, and it can be said that the energy storage device of the curve indicated by symbol A is within the normal range in consideration of the environmental difference (temperature difference). On the other hand, a curve indicated by symbol C represents a change in the voltage of the energy storage device, the change being more degraded than assumed. Thus, when the environmental difference is not taken into consideration, the normal energy storage device may be determined to have been degraded. In other words, the consideration of the environmental difference makes it possible to prevent an erroneous determination that a normal energy storage device has been degraded.

Figure 8:
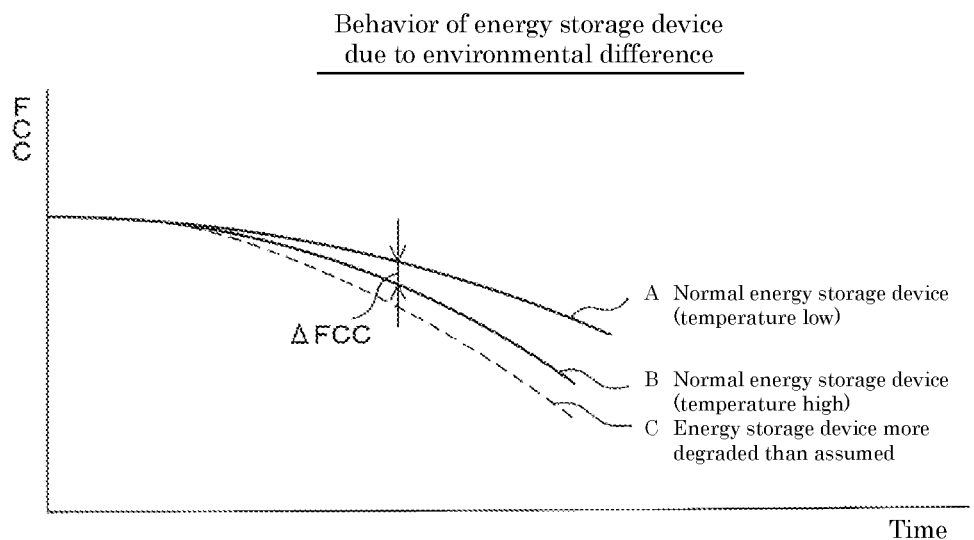
FIG. 8 is a schematic diagram showing another example of the difference in the behavior of the energy storage device due to the environmental difference.

FIG. 8 is a schematic diagram showing another example of the difference in the behavior of the energy storage device due to the environmental difference. In FIG. 8, the vertical axis represents the full charge capacity (FCC), and the horizontal axis represents the time. In the example of FIG. 8, the environmental difference is a temperature difference. The full charge capacity is a capacity when the energy storage device is fully charged. In the figure, a curve indicated by symbol A shows a change in a full charge capacity of a normal energy storage device. If the change in the full charge capacity of the energy storage device of the curve indicated by symbol B is observed without considering the temperature difference, since the full charge capacity is low as compared to the change in the full charge capacity of the normal energy storage device indicated by symbol A, it can be determined that the degradation of the energy storage device is progressing, and there is a possibility that the energy storage device of the curve indicated by the symbol B is determined to have been deteriorated. However, in practice, the change in the full charge capacity of the energy storage device of the curve indicated by symbol B represents a change at a temperature considerably higher than the temperature (low: ordinary) of the normal energy storage device indicated by symbol A, and it can be said that the energy storage device of the curve indicated by symbol B is within the normal range in consideration of the environmental difference (temperature difference). On the other hand, the curve indicated by symbol C represents a change in the full charge capacity of the energy storage device, the change being more degraded than assumed. Thus, when the environmental difference is not taken into consideration, the normal energy storage device may be determined to have been degraded. In other words, the consideration of the environmental difference makes it possible to prevent an erroneous determination that a normal energy storage device has been degraded.

Figure 9:
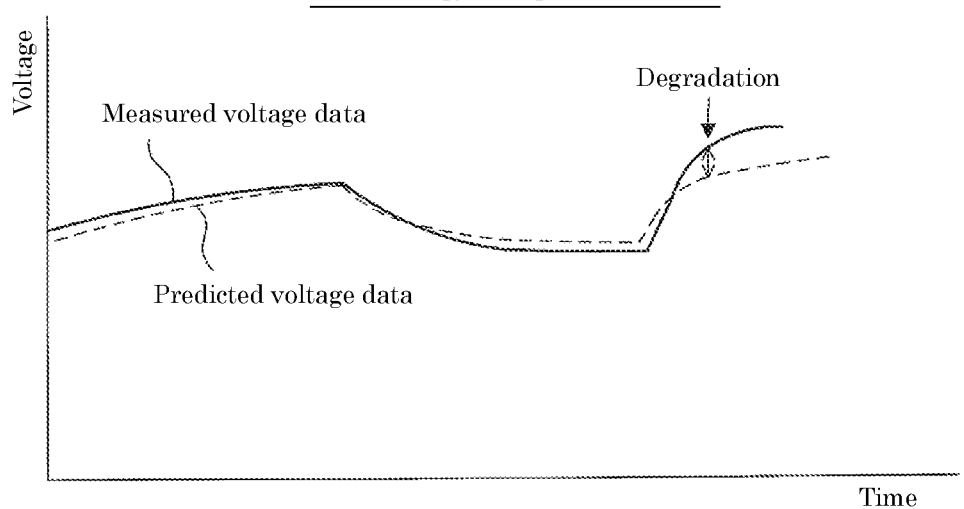
FIG. 9 is a schematic diagram showing an example of time-series data of the voltage of the energy storage device.

FIG. 9 is a schematic diagram showing an example of time-series data of the voltage of the energy storage device. In FIG. 9, the vertical axis represents the voltage, and the horizontal axis represents the time. The voltage is, for example, a change when the energy storage device is being charged and discharged. In the figure, the measured voltage data indicates a voltage value actually measured by the voltage sensor. The predicted voltage data indicates a voltage value assumed in advance in consideration of an assumed environmental difference of the energy storage device. When the difference or the ratio between the measured voltage value and the predicted voltage value is within a predetermined voltage threshold, it can be determined that the energy storage device is in a state within assumption in consideration of the environmental difference and is normal. However, when the difference or the ratio between the measured voltage value and the predicted voltage value becomes larger than a predetermined voltage threshold, it can be determined that the energy storage device has deviated from the state within assumption and has been deteriorated (a position indicated by an arrow in the figure). Note that this example is the case of the energy storage device degraded more than assumed, and the difference or the ratio is within the error range in the normal case. Even in the normal state, a deviation within a predetermined range occurs due to a temperature difference.

That is, the learning model 26 can be caused to learn by the time-series data of the difference or the ratio between the measured voltage value and the predicted voltage value and the data relating to the determination of the degradation of the energy storage device.

Figure 10:
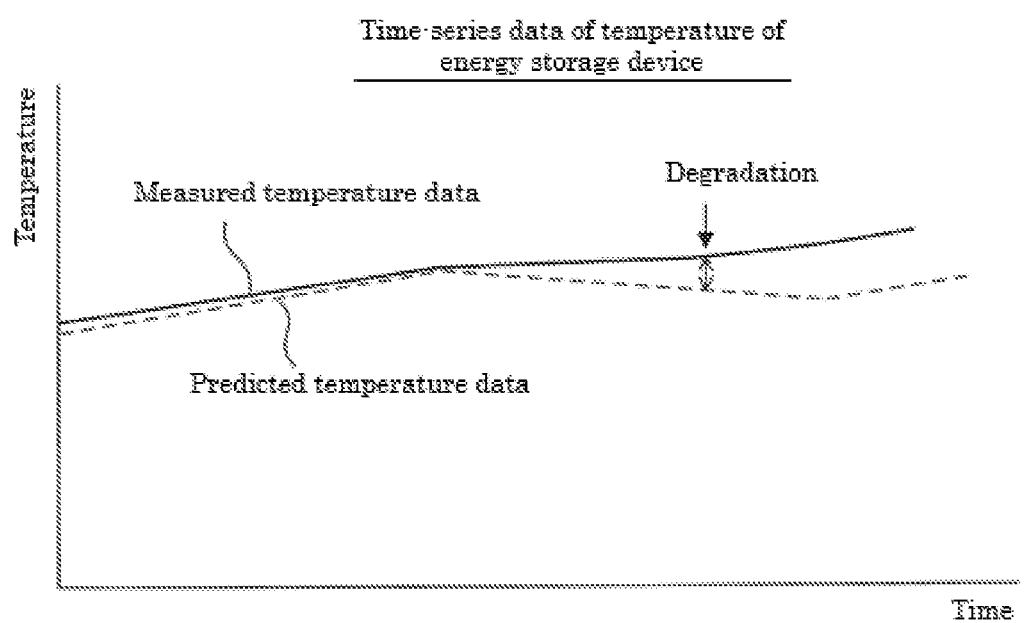
FIG. 10 is a schematic diagram showing an example of time-series data of the temperature of the energy storage device.

FIG. 10 is a schematic diagram showing an example of time-series data of the temperature of the energy storage device. In FIG. 10, the vertical axis represents the temperature, and the horizontal axis represents the time. The temperature is, for example, a change when the energy storage device is being charged and discharged. In the figure, the measured temperature data indicates the temperature value actually measured by the temperature sensor. The predicted temperature data indicates a temperature value assumed in advance in consideration of an assumed environmental difference of the energy storage device. When the difference or the ratio between the measured temperature value and the predicted temperature value is within a predetermined temperature threshold, it can be determined that the energy storage device is in a state within assumption in consideration of the environmental difference and that the device is normal. When the difference or the ratio between the measured temperature value and the predicted temperature value becomes larger than a predetermined temperature threshold, it can be determined that the energy storage device has deviated from the assumed state and has been deteriorated (a position indicated by an arrow in the figure).

That is, the learning model 26 can be caused to learn by the time-series data of the difference or the ratio between the measured temperature value and the predicted temperature value and the data relating to the determination of the degradation of the energy storage device.

Although the voltage value and the temperature value have been described in the above example, the present invention is not limited thereto. For example, the learning model 26 can be caused to learn by the time-series data of the difference or the ratio between the measured current value and the predicted current value and the data relating to the determination of the degradation of the energy storage device. Further, for example, as shown in FIG. 6, in the energy storage module in which a plurality of energy storage cells are stacked, the learning model 26 can be caused to learn by the time-series data of the difference or the ratio between the measured pressure value and the predicted pressure value of the pressure value between the cells and the data relating to the determination of the degradation of the energy storage device.

Figure 11:
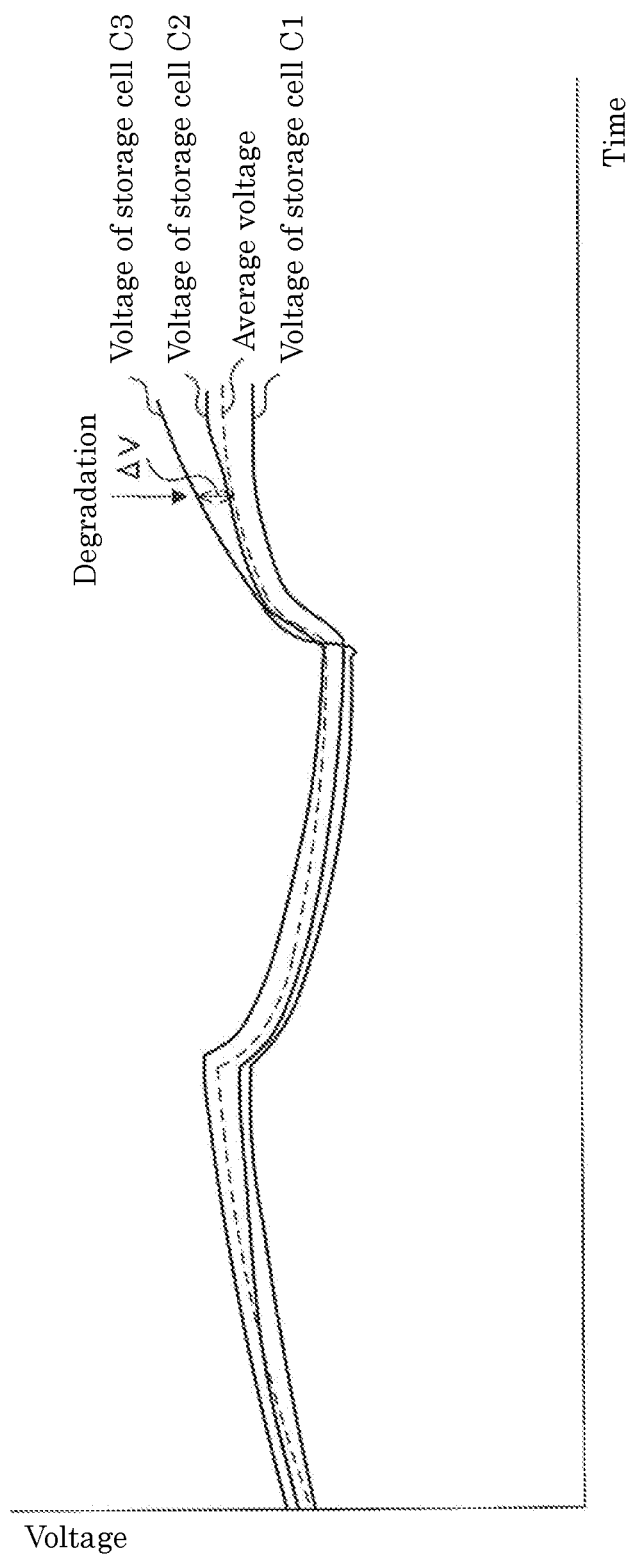
FIG. 11 is a schematic diagram showing an example of time-series data of the voltage and the average voltage of each energy storage cell.

FIG. 11 is a schematic diagram showing an example of the time-series data of the voltage and the average voltage of each energy storage cell. In FIG. 11, the vertical axis represents the voltage, and the horizontal axis represents the time. The voltage is, for example, a change when the energy storage device is being charged and discharged. For convenience, the energy storage cells are C1, C2, and C3. The figure shows the voltage values of the energy storage cells C1, C2, C3 and the average values of the voltage values of the energy storage cells C1, C2, C3. In consideration of the environmental difference between the energy storage cells, each of the voltage values of the energy storage cells C1, C2, C3 has a constant variation (acceptable variation when normal). That is, when the difference or the ratio between each of the voltage values of the energy storage cells C1, C2, C3 and the average value of the voltage values is within a predetermined voltage threshold, it can be determined that the energy storage cell is in a state within assumption in consideration of the environmental difference and that the cell is normal. However, when the difference or the ratio between each of the voltage values of the energy storage cells C1, C2, C3 and the average value becomes larger than a predetermined voltage threshold, it can be determined that the energy storage cell has deviated from the state within assumption and has been deteriorated (a position indicated by an arrow in the figure).

That is, the learning model 26 can be caused to learn by the time-series data of the difference or the ratio between each of the voltage values and the average value of the plurality of energy storage cells and the data relating to the determination of the degradation of the energy storage device. Note that the time-series data may be time-series data of the measured value or time-series data of the predicted value. The time-series data is not limited to a voltage value but may be a current value or a pressure value.

Figure 12:
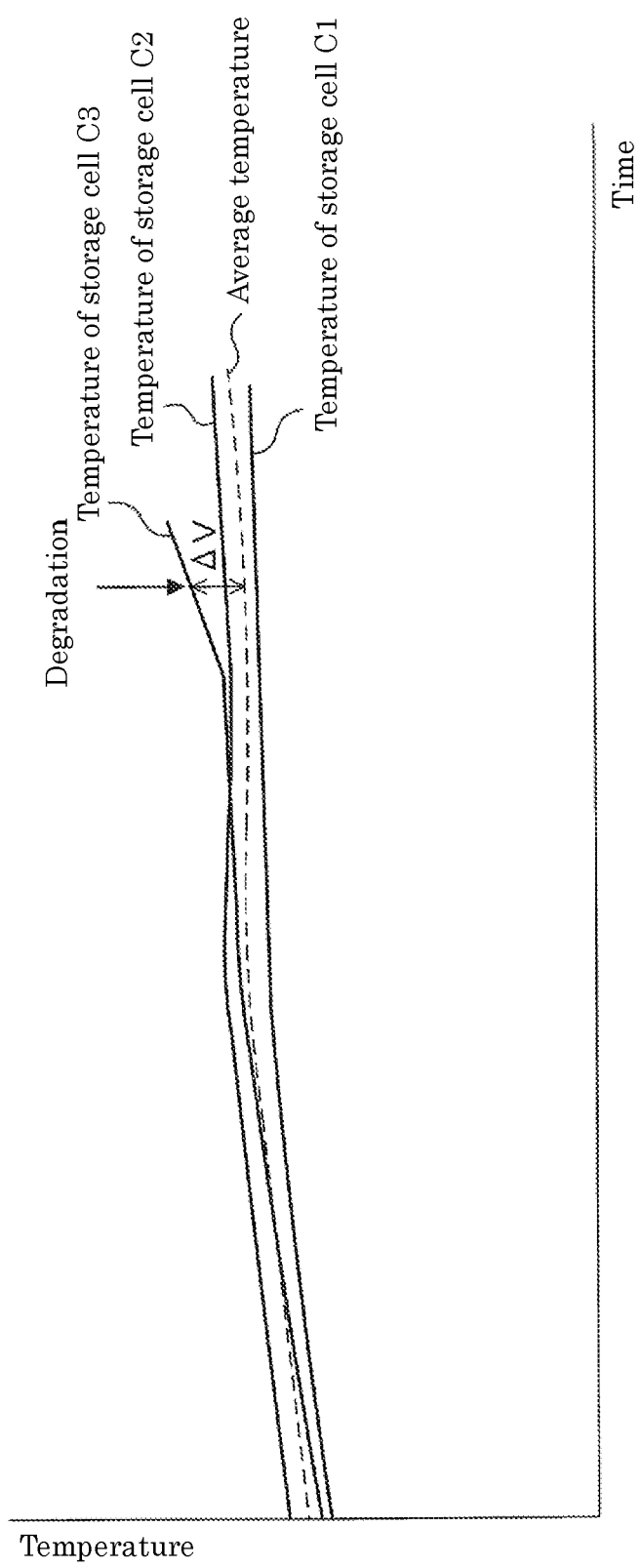
FIG. 12 is a schematic diagram showing an example of time-series data of the temperature and the average temperature of each energy storage cell.

FIG. 12 is a schematic diagram showing an example of time-series data of the temperature and the average temperature of each energy storage cell. In FIG. 12, the vertical axis represents the temperature, and the horizontal axis represents the time. The temperature is, for example, a change when the energy storage device is being charged and discharged. For convenience, the energy storage cells are C1, C2, and C3. The figure shows the temperatures of the energy storage cells C1, C2, C3 and the average values of the temperatures of the energy storage cells C1, C2, C3. In consideration of the environmental difference between the energy storage cells, each of the temperatures of the energy storage cells C1, C2, C3 has a constant variation (acceptable variation when normal). That is, when the difference or the ratio between each of the temperatures of the energy storage cells C1, C2, C3 and the average value of the temperatures is within a predetermined voltage threshold, it can be determined that the energy storage cell is in a state within assumption in consideration of the environmental difference and that the cell is normal. However, when the difference or the ratio between each of the temperatures of the energy storage cells C1, C2, C3 and the average value becomes larger than a predetermined temperature threshold, it can be determined that the energy storage cell has deviated from the state within assumption and has been deteriorated (a position indicated by an arrow in the figure).

That is, the learning model 26 can be caused to learn by the time-series data of the difference or the ratio between each of the temperature and the average value of the plurality of energy storage cells and the data relating to the determination of the degradation of the energy storage device. Note that the time-series data may be time-series data of the measured value or time-series data of the predicted value.

In the following, first, the learning mode of the learning model 26 will be described.

The processing unit 23 acquires measured time-series data including a measured electric value and a measured temperature value of the energy storage device. The electrical value includes voltage and current. The measured electric value includes, for example, a voltage value measured by the voltage sensor and a current value measured by a current sensor. The measured temperature value is a temperature measured by the temperature sensor.

The predicted data generation unit 24 generates predicted time-series data including a predicted electric value and a predicted temperature value of the energy storage device. The predicted electric value or the predicted temperature value is not a value actually measured by the sensor, but a value assumed in advance in accordance with environmental states such as installation conditions of the energy storage device and ambient temperature, and means a calculated value or an estimated value.

The processing unit 23 can acquire predicted time-series data generated by the predicted data generation unit 24, including the predicted electric value and the predicted temperature value of the energy storage device.

The learning data generation unit 25 generates learning data having measured time-series data and predicted time-series data as input data and having determination of degradation of the energy storage device as output data.

The learning processing unit 27 causes the learning model 26 to learn based on the generated learning data.

The learning data generation unit 25 need not be provided in the server apparatus 2 but the learning data generation unit 25 may be provided in another server apparatus, the learning data generated in the server apparatus may be acquired, and the learning processing unit 27 may cause the learning model 26 to learn based on the acquired learning data. The same applies to the following description of the present specification.

The learning model 26 can learn not only the measured time-series data including the measured electric value and the measured temperature value of the energy storage device but also predicted time-series data including the predicted electric value and the predicted temperature value of the energy storage device. That is, it is possible to learn how the measured electric value and the measured temperature value of the energy storage device change and how the predicted electric value and the predicted temperature value of the energy storage device change to determine whether the energy storage device is normal or has degraded. Since the predicted time-series data is data that is assumed in accordance with environmental states such as installation conditions of the energy storage device and ambient temperature, the learning model 26 can learn the charge-discharge behavior of the energy storage device due to the environmental difference.

Hence, it is possible to generate the learning-completed learning model 26 that can accurately determine the degradation of the energy storage device even when there are environmental differences such as installation conditions of the energy storage device and ambient temperature.

FIG. 13 is a configuration diagram showing a first example of the learning data. The data shown in FIG. 13 shows input data for learning. As shown in FIG. 13, the input data includes measured value data and predicted value data. The measured value data and the predicted value data are time-series data (time t1, t2, t3, . . . tN) of the voltage, current, temperature, and pressure of the energy storage device. For example, the time-series data of the measured voltage value is represented by Va(t1), Va(t), Va(t3), . . . , and Va(tN), and the time-series data of the predicted voltage value is represented by Ve(t1), Ve(t), Ve(t3), . . . , and Ve(tN). The same applies to other data.

The learning data generation unit 25 generates a learning data having, as input data, the respective pieces of time-series data of the difference or the ratio between the measured electric value and the predicted electric value and the difference or the ratio between the measured temperature value and the predicted temperature value.

The learning model 26 can learn how the difference or the ratio between the measured electric value and the predicted electric value changes to determine whether the energy storage device is normal or has been degraded. The learning model 26 can learn how the difference or the ratio between the measured temperature value and the predicted temperature value changes to determine whether the energy storage device is normal or has been degraded. Thus, the learning model 26 can learn the charge-discharge behavior of the energy storage device due to the environmental difference.

Specifically, the learning data generation unit 25 can generate learning data having, as input data, measured time-series data that includes a measured voltage value and predicted time-series data that includes a predicted voltage value.

In this case, the learning model 26 can learn how the measured voltage value and the predicted voltage value changes to determine whether the energy storage device is normal or has been degraded. Thus, the learning model 26 can learn whether the energy storage device is normal or has been degraded in accordance with the assumed voltage difference.

The learning data generation unit 25 can generate learning data having the measured time-series data including the measured current value and the predicted time-series data that includes the predicted current value as input data.

In this case, the learning model 26 can learn how the measured current value and the predicted current value change to determine whether the energy storage device is normal or has been degraded. Hence, the learning model 26 can learn whether the energy storage device is normal or has been degraded in accordance with the assumed current difference.

The learning data generation unit 25 can generate learning data having time-series data that includes the difference or the ratio between the measured pressure value and the predicted pressure value as input data.

In this case, the learning model 26 can learn how the measured pressure value and the predicted pressure value have changed to determine whether the energy storage device is normal or has been degraded. Thus, the learning model 26 can learn whether the energy storage device is normal or has been degraded in accordance with the assumed pressure difference.

FIG. 14 is a configuration diagram showing a second example of the learning data. The data shown in FIG. 14 shows input data for learning. As shown in FIG. 14, the input data can be time-series data of the difference between the measured value and the predicted value. Specifically, the data is time-series data (time t1, t2, t3, . . . tN) of the voltage difference, the current difference, the temperature difference, and the pressure difference. For example, the time-series data of the voltage difference is represented by {Va(t1)–Ve(t1)}, {Va(t2)–Ve(t2)}, {Va(t3)–Ve(t3)}, . . . , and {Va(tN)–Ve(tN)}. The same applies to other data.

FIG. 15 is a configuration diagram showing a third example of learning data. The data shown in FIG. 15 shows input data for learning. As shown in FIG. 15, the input data can be time-series data of the ratio between the measured value and the predicted value. Specifically, the data is time-series data (time t1, t2, t3, . . . tN) of the voltage ratio, the current ratio, the temperature ratio, and the pressure ratio. For example, the time-series data of the voltage ratio is represented by {Va(t1)/Ve(t1)}, {Va(t2)/Ve(t2)}, {Va(t3)/Ve(t3)}, . . . , and {Va(tN)Ne(tN)}. The same applies to other data.

The learning data generation unit 25 can generate learning data having the presence or absence of an environmental abnormality relating to the energy storage device as output data. By causing the learning model 26 to learn the presence or absence of an environmental abnormality, for example, it is possible to learn not only the degradation of the energy storage device but also that there is an environmental abnormality, and also to distinguish and determine the degradation of the energy storage device from the environmental abnormality.

Figure 16:
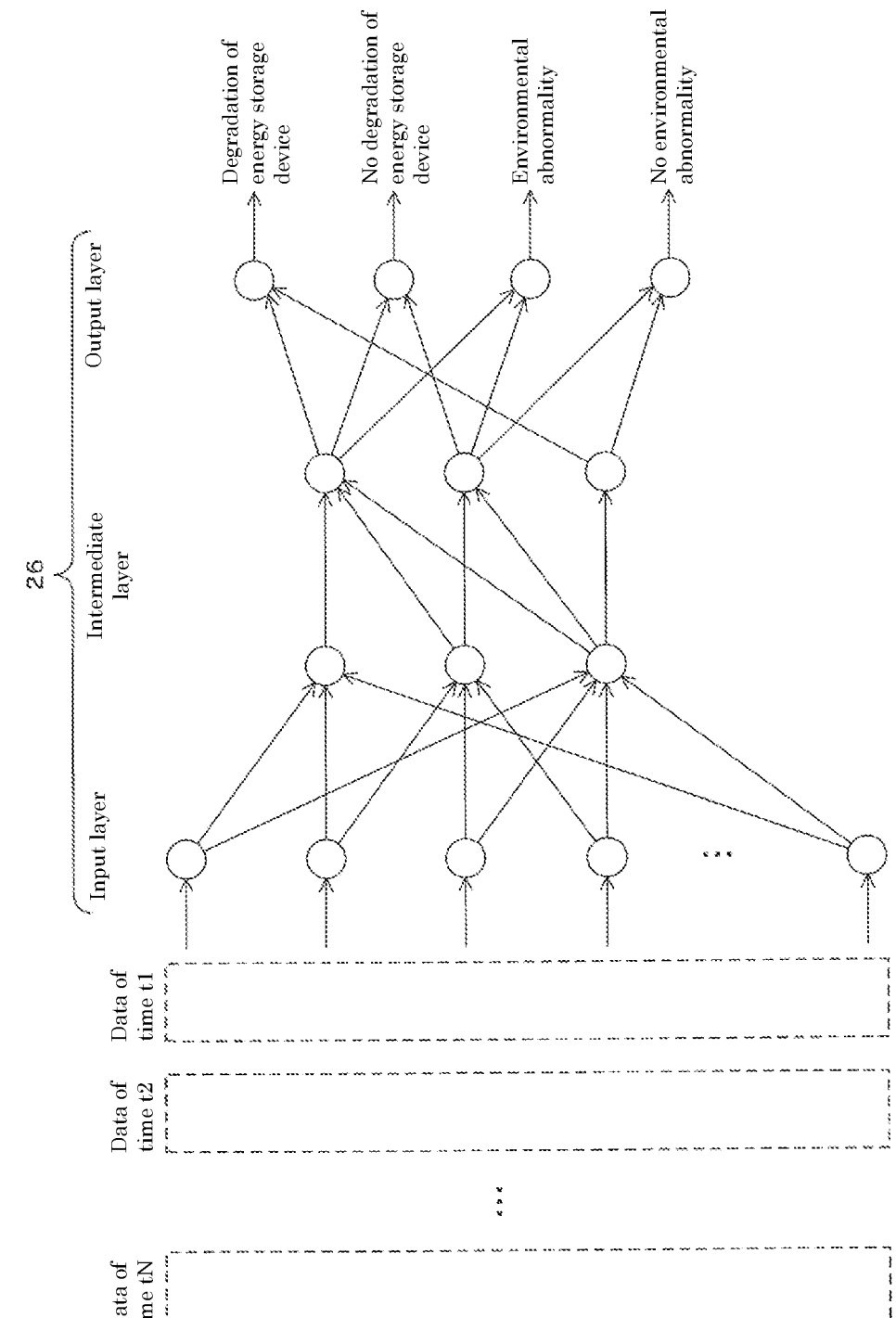
FIG. 16 is a schematic diagram showing an example of processing of a learning model in a learning mode.

FIG. 16 is a schematic diagram showing an example of processing of the learning model 26 in the learning mode. As shown in FIG. 16, time-series data of time t1, t2, t3, . . . , and tN are input into the learning model 26. The input time-series data is, for example, data as illustrated in FIGS. 13 to 15. An output value (e.g., either 1 or 0) can be set in the output node of the learning model 26 in accordance with whether the input data is data when the energy storage device is normal or has been degraded, the environment is normal, or the environment is abnormal. For example, when the input data for learning is data in the case where the energy storage device has been degraded, 1 may be set in the output node of "Degradation of energy storage device," and 0 may be set in the other output nodes. When the input data for learning is data in the case where the environment is abnormal, 1 may be set in the output node of "Environmental abnormality" and 0 may be set in the other output nodes. The output data in the learning mode may be a probability when the energy storage device is normal or has been degraded, the environment is normal, or the environment is abnormal. In this case, the learning model 26 can be caused to learn so that the output value of the output node approaches the probability.

Next, learning data in consideration of variations among energy storage cells will be described.

The learning data generation unit 25 can generate learning data having, as input data, measured time-series data that includes the difference or the ratio between the measured electric value of each of the plurality of energy storage cells forming the energy storage module and the average value of the measured electric values of the plurality of energy storage cells. The electric value can be, for example, a voltage value or a current value.

Hence the learning model 26 can learn how the difference or the ratio between the average value obtained by averaging the measured electric values of the plurality of energy storage cells and the measured electric values of the plurality of energy storage cells changes to determine whether the energy storage device is normal or has been degraded. Thus, the learning model 26 can learn whether the energy storage device is normal or has been degraded in accordance with the measured electric value between the energy storage cells.

The learning data generation unit 25 can generate learning data having, as input data, predicted time-series data that includes the difference or the ratio between each of the predicted electric values of the plurality of energy storage cells forming the energy storage module and the average value of the predicted electric values of the plurality of energy storage cells.

Hence the learning model 26 can learn how the difference or the ratio between the average value obtained by averaging the predicted electric values of the plurality of energy storage cells and the predicted electric values of the plurality of energy storage cells changes to determine whether the energy storage device is normal or has been degraded. Thus, the learning model 26 can learn whether the energy storage device is normal or has been degraded in accordance with the prior environmental difference between the energy storage cells.

The learning data generation unit 25 can generate learning data having, as input data, predicted time-series data that includes the difference or the ratio between each of the predicted temperature values of the plurality of energy storage cells forming the energy storage module and the average value of the predicted temperature values of the plurality of energy storage cells. The predicted temperature value of each of the plurality of energy storage cells can be obtained based on the predicted current value flowing in the energy storage cell, the arrangement status of the energy storage cells in the energy storage module, the predicted temperature value of the energy storage module, and the like.

Thus, the learning model 26 can learn how the difference or the ratio between the average value obtained by averaging the predicted temperature values of the plurality of energy storage cells and the predicted temperature values of the plurality of energy storage cells changes to determine whether the energy storage device is normal or has been degraded. Thus, the learning model 26 can learn whether the energy storage device is normal or has been degraded in accordance with the prior environmental difference between the energy storage cells.

Next, a determination mode by the learning-completed learning model 26 will be described.

The input data generation unit 28 generates input data including measured time-series data and predicted time-series data.

Figure 17:
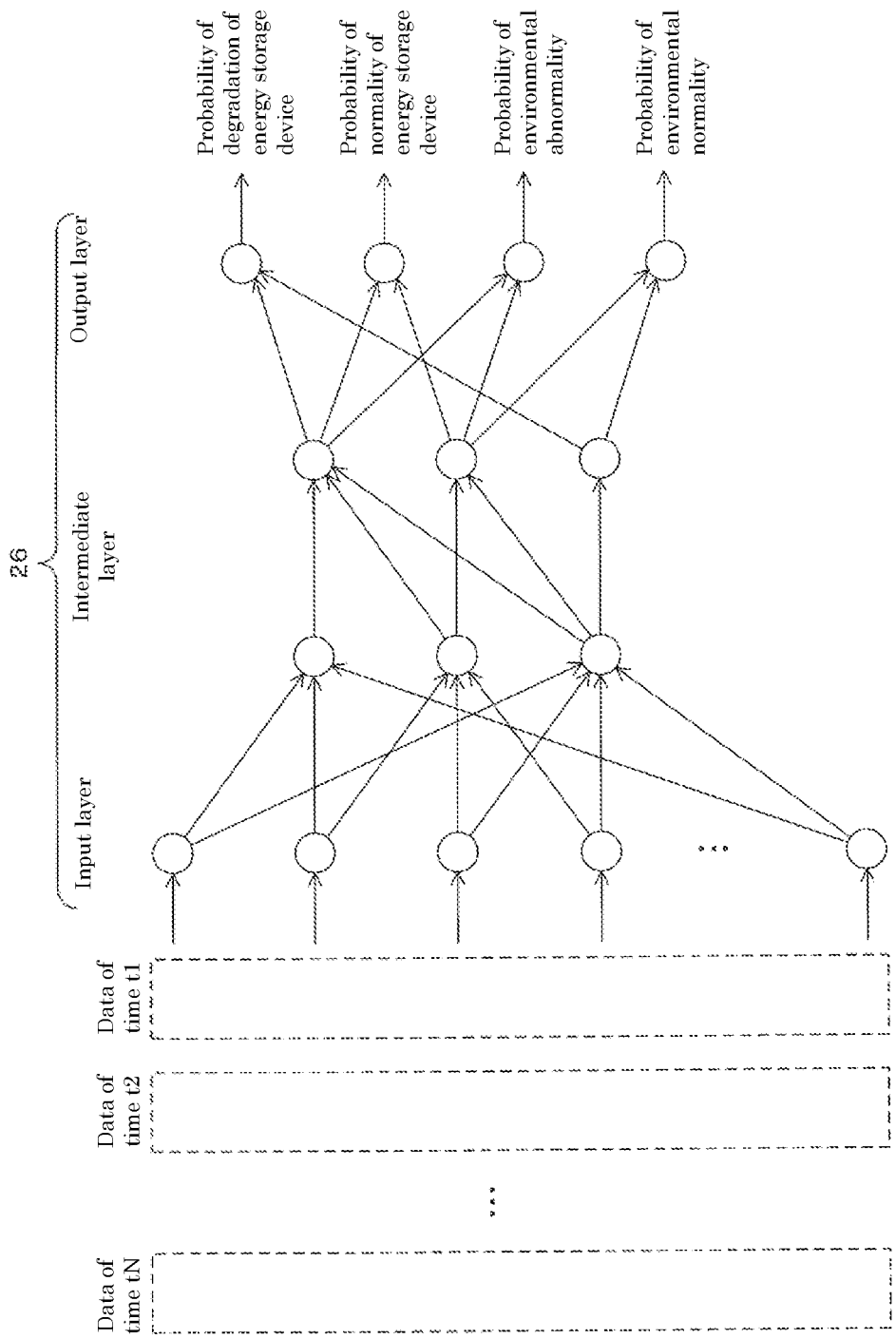
FIG. 17 is a schematic diagram showing an example of processing of the learning model in the determination mode.

FIG. 17 is a schematic diagram showing an example of processing of the learning model 26 in the determination mode. As shown in FIG. 17, time-series data of time t1, t2, t3, . . . , and tN are input into the learning-completed learning model 26. The input time-series data has the same structure as the data exemplified in FIGS. 13 to 15, for example. The learning-completed learning model 26 determines the degradation of the energy storage device and the presence or absence of the environmental abnormality based on the input time-series data. Note that it is not essential to determine the presence or absence of the environmental abnormality, but only the degradation of the energy storage device may be determined.

The probability of degradation of the energy storage device, the probability of normality of the energy storage device, the probability of environmental abnormality, and the probability of environmental normality are output in the output node of the learning-completed learning model 26.

In this manner, the learning-completed learning model 26 can use the measured time-series data and the predicted time-series data as input data to output the determination of the deterioration of the energy storage device. The learning-completed learning model 26 has learned how the measured electric value and the measured temperature value of the energy storage device change and how the predicted electric value and the predicted temperature value of the energy storage device change to determine whether the energy storage device is normal or has been degraded. Since the predicted time-series data is data that is assumed in accordance with environmental states such as installation conditions of the energy storage device and ambient temperature, the learning-completed learning model 26 has learned the charge-discharge behavior of the energy storage device due to the environmental difference.

Hence, it is possible to accurately determine the degradation of the energy storage device even when there are environmental differences such as installation conditions of the energy storage device and ambient temperature.

Figure 18:
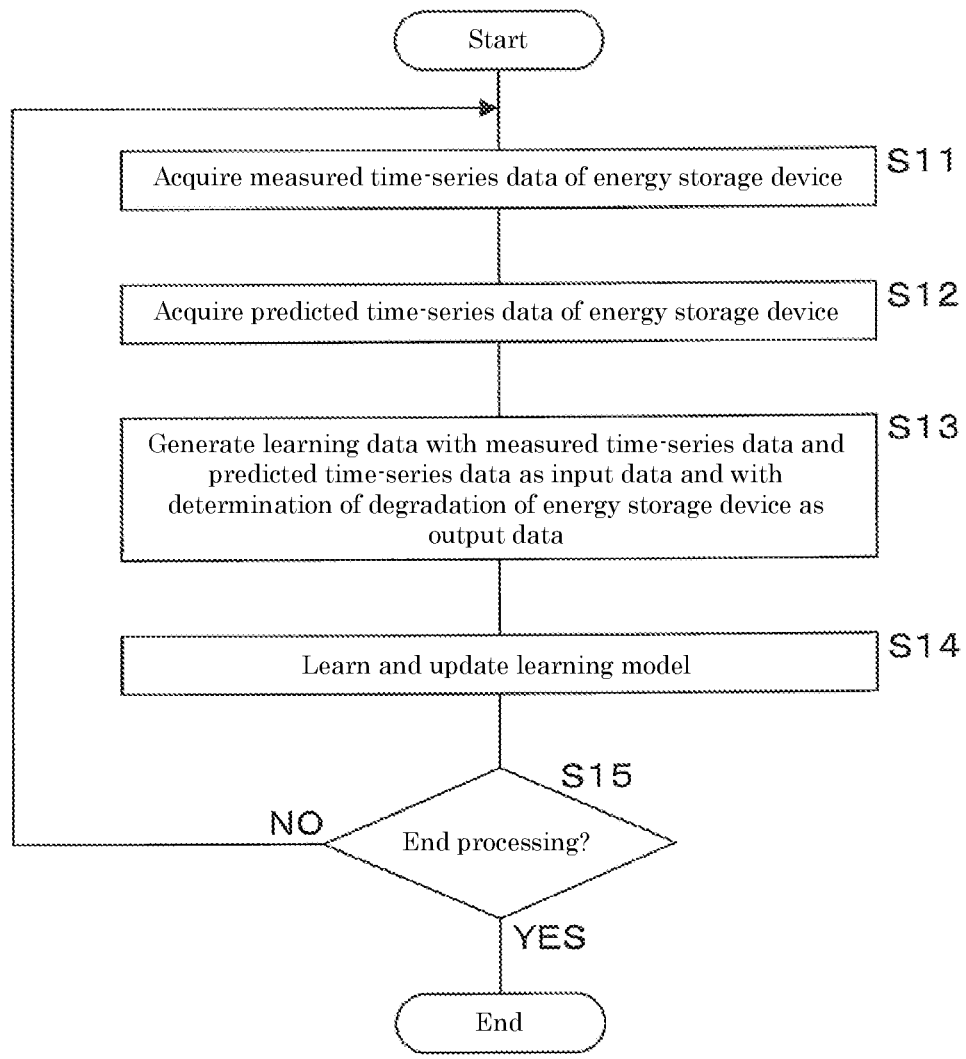
FIG. 18 is a flowchart showing an example of a processing procedure of a processing unit in the learning mode.

FIG. 18 is a flowchart showing an example of the processing procedure of the processing unit 23 in the learning mode. The processing unit 23 acquires measured time-series data of the energy storage device (S11) and acquires predicted time-series data of the energy storage device (S12).

The processing unit 23 generates learning data having the measured time-series data and the predicted time-series data as input data and having the determination of the degradation of the energy storage device as output data (S13). The processing unit 23 performs the learning and update of the learning model 26 based on the generated learning data (S14) and determines whether or not to end the processing (S15). When it is determined not to end the processing (NO in S15), the processing unit 23 continues the processing from S11, and when it is determined to end the processing (YES in S15), the processing is ended.

Figure 19:
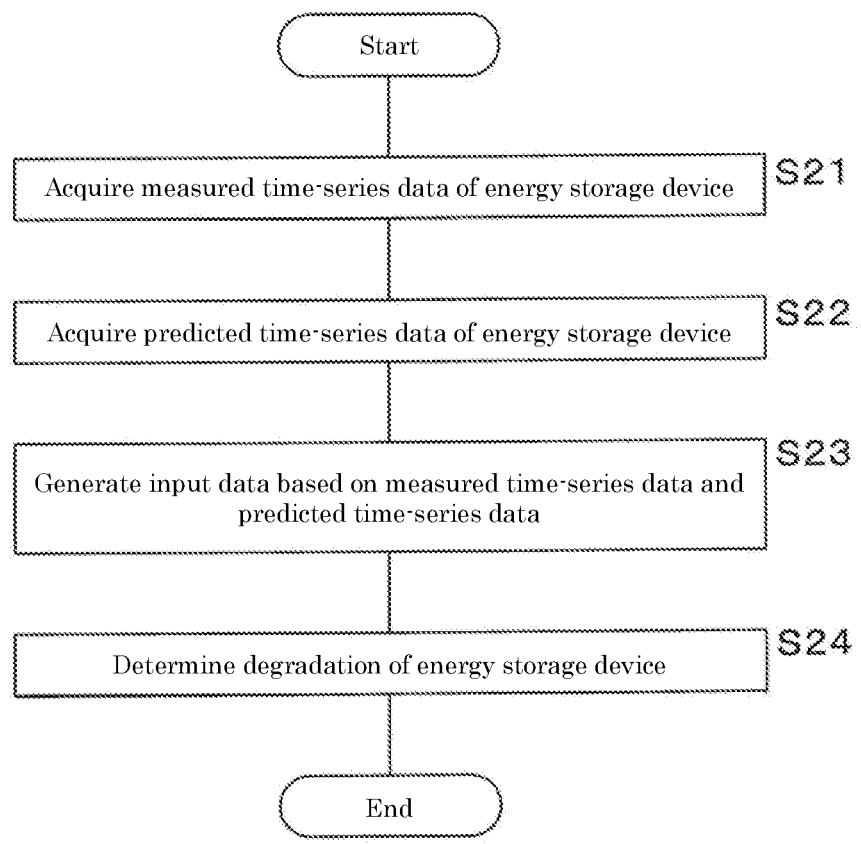
FIG. 19 is a flowchart showing an example of the processing procedure of the processing unit in the determination mode.

FIG. 19 is a flowchart showing an example of the processing procedure of the processing unit 23 in the determination mode. The processing unit 23 acquires measured time-series data of the energy storage device (S21) and acquires predicted time-series data of the energy storage device (S22).

The processing unit 23 generates input data based on the measured time-series data and the predicted time-series data (S23), determines the degradation of the energy storage device (S24), and ends the processing.

As described above, according to the server apparatus 2 of the present embodiment, since the detailed behavior of the energy storage device in the actual state of use and the influence of the assigned environmental difference can also be learned by the learning model 26 based on the sensor information detected by the energy storage device operating in the mobile body or facility, it is possible to accurately determine the degradation of the energy storage device. Further, for example, it is possible to determine the presence or absence of an environmental abnormality in which the energy storage device appears abnormal even though being normal.

In the embodiment described above, the server apparatus 2 has been configured to include the learning model 26 and the learning processing unit 27, but the present invention is not limited thereto. For example, the learning model 26 and the learning processing unit 27 may be provided in one or more other servers. The degradation determination apparatus is not limited to the server apparatus 2. For example, an apparatus such as a degradation determination simulator may be used.

Second Embodiment

The first embodiment described above has a configuration where whether the energy storage device has been degraded earlier than assumed is determined by making a distinction between a determination that the energy storage device has actually been degraded and an erroneous determination that the energy storage has been degraded due to an environmental difference even though being normal. However, it is also possible to determine an abnormality factor of the energy storage system from the same viewpoint. The second embodiment will be described below.

Figure 20:
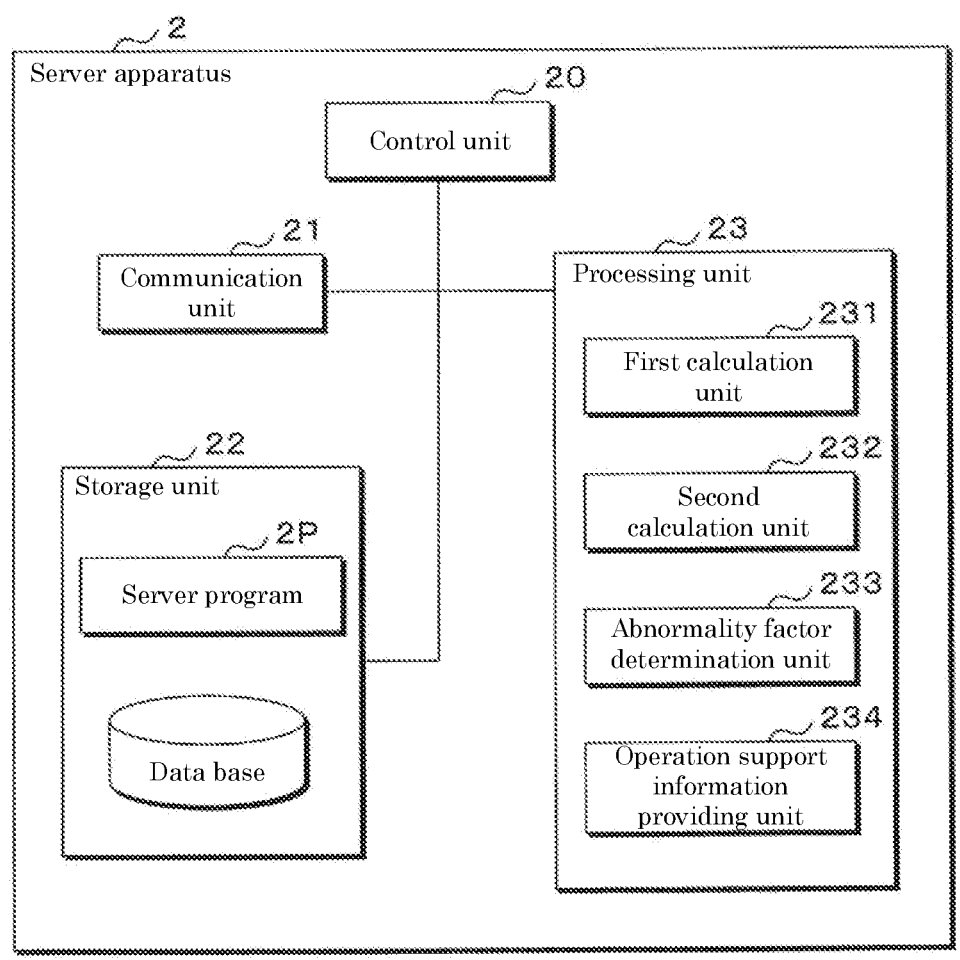
FIG. 20 is a block diagram showing an example of the configuration of the server apparatus serving as the abnormality factor determination apparatus according to the second embodiment.

FIG. 20 is a block diagram showing an example of the configuration of the server apparatus 2 serving as the abnormality factor determination apparatus according to the second embodiment. The difference from the server apparatus 2 shown in FIG. 4 is that the processing unit 23 includes a first calculation unit 231, a second calculation unit 232, an abnormality factor determination unit 233, and an operation support information provision unit 234. The same parts are denoted by the same symbols and the description thereof will be omitted.

The processing unit 23 has a function as the measured value acquisition unit and acquires measured values of currents, voltages, and temperatures of a plurality of energy storage devices. The measured value can be acquired from a value measured by sensors (current sensor, voltage sensor, temperature sensor) of the plurality of energy storage devices included in the energy storage system. The frequency of acquisition of the measured value can be appropriately determined in accordance with the operation state of the energy storage system, and the like. For example, in an operation state where a load fluctuation is relatively large, the frequency of acquiring the measured value can be increased (e.g., five minutes every hour). Further, in an operation state where the load fluctuation is relatively small, the frequency of acquiring the measured value can be reduced (e.g., five minutes every six hours).

The processing unit 23 has a function as the predicted value acquisition unit and acquires predicted values of voltages and temperatures of a plurality of energy storage devices. The predicted value is not a value actually measured by the sensor, but a value assumed in advance in accordance with environmental states such as installation conditions of the plurality of energy storage devices and ambient temperature, and means a calculated value or an estimated value, and means a calculated value or an estimated value. The predicted value may be generated in advance by the server apparatus 2 or by an external apparatus.

The first calculation unit 231 calculates a measured voltage difference and a measured temperature difference between required energy storage devices based on the measured values acquired by the processing unit 23.

The second calculation unit 232 calculates the difference between the measured value and the predicted value with respect to each of the voltage and temperature of one of the required energy storage devices based on the measured value and the predicted value acquired by the processing unit 23.

FIG. 21 is an explanatory diagram showing an example of the relationship between the measured value and the predicted value. FIG. 21 shows a state in which a plurality of energy storage devices forming the energy storage system are connected in series. As shown in FIG. 6, a plurality of energy storage cells are connected in series to form one energy storage module. The energy storage module forms a plurality of banks connected in series. The energy storage cells shown in FIG. 21, for example, illustrate required two energy storage cells i, j among a plurality of energy storage cells forming the bank. Note that the energy storage cells i, j can be selected from a plurality of energy storage cells in accordance with the arrangement as shown in FIG. 6.

The current flowing through the energy storage cells i, j is expressed as a measured cell current Ie. The measured cell voltage of the energy storage cell i is represented by Vei, the measured cell voltage of the energy storage cell j is represented by Vej, and the measured inter-cell voltage difference between the energy storage cells i, j is represented by $\Delta V$ ($\Delta V=Vei-Vej$).

The predicted cell voltage of the energy storage cell i is represented by Vci, and the voltage difference between measured and predicted values of the energy storage cell i is represented by $\Delta Veci$ ($\Delta Veci=Vei-Vci$). The predicted cell voltage of the energy storage cell j is expressed by Vbj, and the voltage difference between measured and predicted values of the energy storage cell j is expressed by $\Delta Vecj$ ($\Delta Vecj=Vej-Vcj$).

The measured cell temperature of the energy storage cell i is represented by Tei, the measured cell temperature of the energy storage cell j is represented by Tej, and the measured inter-cell temperature difference between the energy storage cells i, j is represented by $\Delta T$ ($\Delta T=Tei-Tej$).

The predicted cell temperature of the energy storage cell i is represented by Vci, and the difference between measured and predicted temperatures of the energy storage cell i is represented by $\Delta Teci$ ($\Delta Teci=Tei-Tci$). The predicted cell temperature of the energy storage cell j is represented by Vcj, and the difference between measured and predicted temperatures of the energy storage cell j is represented by $\Delta Tecj$ ($\Delta Tecj=Tej-Tcj$).

The abnormality factor determination unit 233 has a function as the determination unit and determines the presence or absence of an abnormality factor relating to the energy storage system based on the measured value and the predicted value acquired by the processing unit 23. Based on the measured values of current (also referred to as measured current values) flowing through the plurality of energy storage devices, it can be determined whether the load is heavy or light, or whether the load fluctuation is large or small. Further, as described above, the voltage difference between the required energy storage devices can be obtained based on the measured value of the voltage of each of the plurality of energy storage devices. Further, the temperature difference between the required energy storage devices can be obtained based on the measured values of the temperatures of the plurality of energy storage devices. The abnormality factor determination unit 233 can discriminate and determine the presence or absence of an abnormality factor, the type of the abnormality factor, for example, the abnormality of the energy storage device (degradation earlier than assumed), the abnormality of the environment of the energy storage device, or the state within assumption (not abnormal) by taking into consideration the measured values of the voltage difference and the temperature difference, the difference between the measured value and the predicted value, and the like.

Next, a specific example of the abnormality factor determination will be described.

Figure 22:
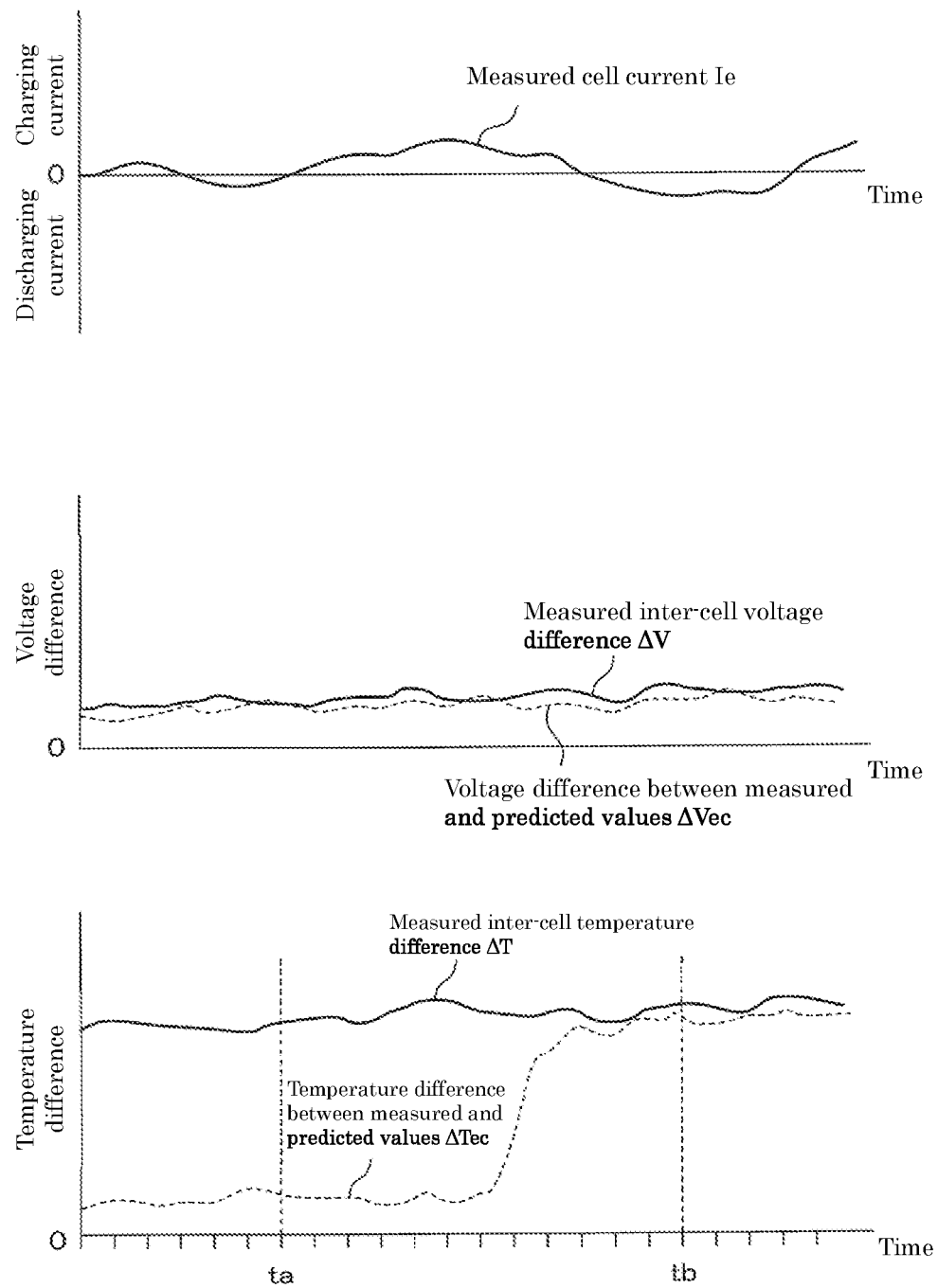
FIG. 22 is a schematic diagram showing a first example of changes in a measured value and a predicted value in a use state of an energy storage system.

FIG. 22 is a schematic diagram showing a first example of changes in a measured value and a predicted value in the use state of an energy storage system. FIG. 22 shows temporal changes in the charge-discharge current, the voltage difference between required storage cells among the plurality of energy storage cells forming the energy storage system, and the temperature difference between the energy storage cells. Note that the change illustrated in FIG. 22 is shown schematically and may differ from an actual change. The length of the illustrated change period may be, for example, several hours, 12 hours, 24 hours, several days, and the like.

As shown in FIG. 22, each of the charge current and the discharge current varies with a relatively small amplitude, and the measured cell current Ie is small. The measured inter-cell voltage difference $\Delta V$ and the voltage difference $\Delta Vec$ between the measured and predicted values are each kept at small values.

As for the temperature difference, in the first half of the change period, the measured inter-cell temperature difference $\Delta T$ has changed at a large value, and the temperature difference $\Delta Tec$ between the measured and predicted values has changed at a small value. When the abnormality factor is determined at a time point ta, it is found that the current flowing in the energy storage cell is small, and no heavy load is being applied to the energy storage cell. Therefore, an influence inherent in the energy storage cell is considered small. Although the measured temperature difference between the energy storage cells is large, the difference from the predicted value (calculated value) is small, so the temperature difference (e.g., environmental differences due to differences in placement and installation conditions) can be determined to be within an assumed range, and the energy storage system can be determined not to be abnormal.

As shown in FIG. 22, in the latter half of the change period, the state of the energy storage system changes, and the measured inter-cell temperature difference ΔT changes at a large value, and the temperature difference ΔTec between the measured and predicted values also changes at a large value. When the abnormality factor is determined at a time point tb, it is found that the current flowing through the energy storage cell is small, and no heavy load is being applied to the energy storage cell. Therefore, an influence inherent in the energy storage cell is considered small. Since the measured temperature difference between the energy storage cells is large and the difference from the predicted value (calculated value) is also large, there is a high possibility that the environment of the energy storage cell exceeds the assumed range, and it can be determined that the environment is abnormal.

Figure 23:
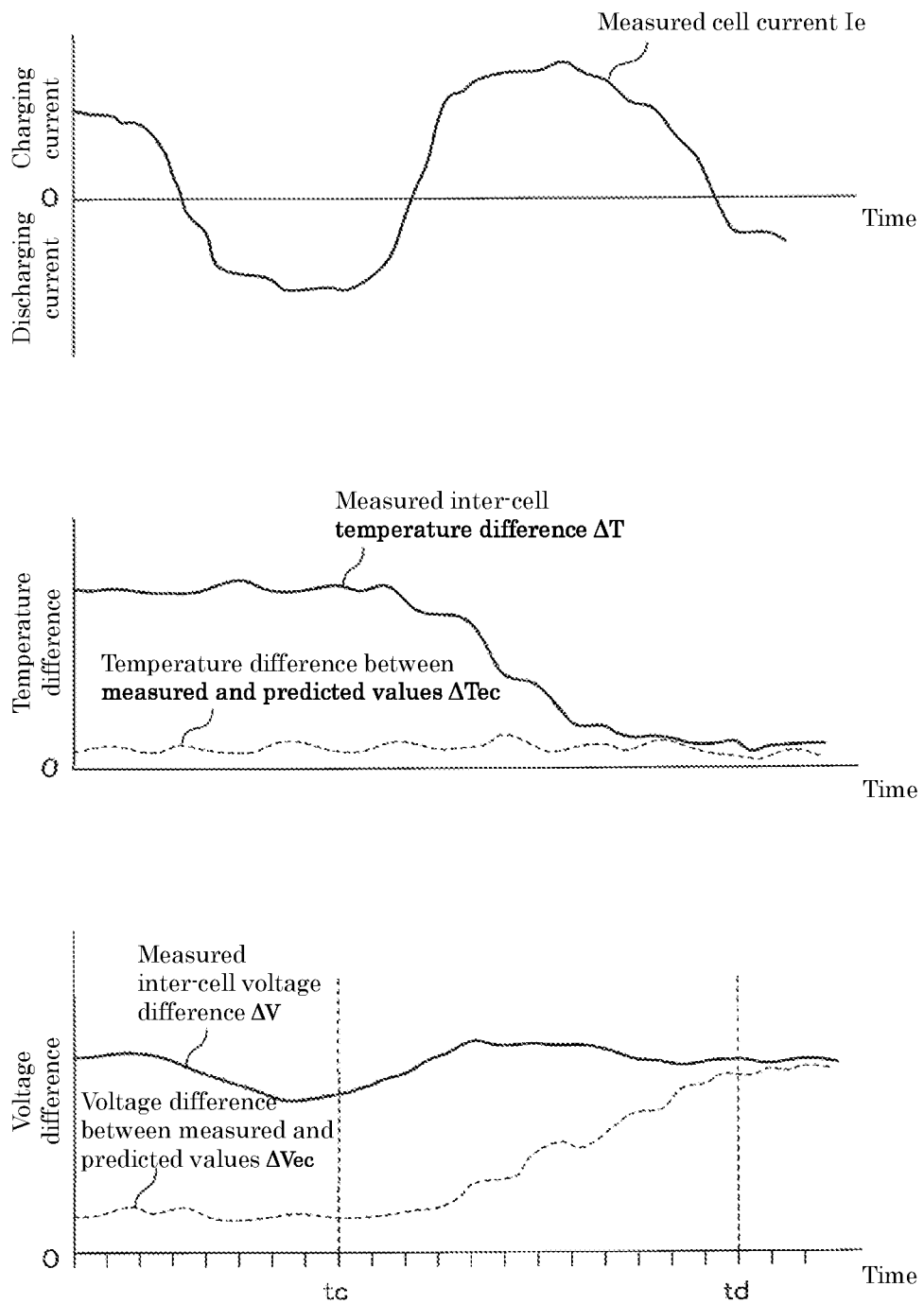
FIG. 23 is a schematic diagram showing a second example of the changes in the measured value and the predicted value in the use state of the energy storage system.

FIG. 23 is a schematic diagram showing a second example of changes in the measured value and the predicted value in the use state of the energy storage system. FIG. 23 shows temporal changes in the charge-discharge current, the voltage difference between required storage cells among the plurality of energy storage cells forming the energy storage system, and the temperature difference between the energy storage cells. Note that the change illustrated in FIG. 23 is shown schematically and may differ from an actual change. The length of the illustrated change period may be, for example, several hours, 12 hours, 24 hours, several days, and the like.

As shown in FIG. 23, each of the charge current and the discharge current varies with a relatively large amplitude, and the measured cell current Ie is large. The measured inter-cell temperature difference ΔT changes at a large value in the first half of the change period and changes at a small value in the second half of the change period. The temperature difference ΔTec between the measured and predicted values changes at a small value.

As for the voltage difference, in the first half of the change period, the measured inter-cell voltage difference ΔV has changed at a large value, and the voltage difference ΔVec between the measured and predicted values has changed at a small value. When the abnormality factor is determined at a time point tc, it is found that the current flowing through the energy storage cell is large and a heavy load is being applied to the energy storage cell. Therefore, it is considered that there is a possibility of an influence peculiar to the energy storage cell. Although the measured voltage difference between the energy storage cells is large, the difference from the predicted value (calculated value) is small, so it is highly likely that the voltage difference is caused by the temperature difference between the energy storage cells or the deviation of the SOC between the energy storage cells, and it can be determined that the voltage difference is within the assumed range, and it can be determined that the energy storage system is not abnormal.

As shown in FIG. 23, in the latter half of the change period, the state of the energy storage system changes, and the measured inter-cell voltage difference ΔV changes at a large value, and the voltage difference ΔVec between the measured and predicted values changes at a large value. When the abnormality factor is determined at a time point td, it is found that the current flowing through the energy storage cell may be large and a heavy load is being applied to the energy storage cell. Therefore, it is considered that there is a possibility of an influence peculiar to the energy storage cell. Since the measured voltage difference between the energy storage cells is large and the difference from the predicted value (calculated value) is also large, it can be determined that the energy storage cell is abnormal.

As described above, the abnormality factor determination unit 233 can determine whether the energy storage device is abnormal or the environment of the energy storage device is abnormal. The abnormality of the energy storage device includes, for example, a case where it is determined that the energy storage device deteriorates earlier than assumed. Further, since the abnormality of the energy storage device and the abnormality of the environment can be discriminated and determined, it is possible to prevent erroneous determination of the abnormality of the energy storage device.

More specifically, the abnormality factor determination unit 233 can determine the abnormality factor based on the measured value of the current acquired by the processing unit 23, the measured voltage difference and the measured temperature difference calculated by the first calculation unit 231, and the difference between the measured value and the predicted value calculated by the second calculation unit 232. For example, when the measured value of the current and the measured voltage difference between the energy storage devices are large and the difference between the measured value and the predicted value is also large, it can be determined that the one storage device is abnormal. On the other hand, when the measured value of the current and the measured voltage difference between the energy storage devices are large, but the difference between the measured value and the predicted value is small, it can be determined that the state is within assumption (not abnormal) due to, for example, the differences in the arrangement and installation conditions between the energy storage devices in the energy storage system, deviations in SOC between the energy storage devices, or the like.

When the measured value of the current is small, the measured temperature difference between the energy storage devices is large, and the difference between the measured value and the predicted value is also large, it can be determined that the environment is abnormal. On the other hand, when the measured value of the current is small and the measured temperature difference between the energy storage devices is large, but the difference between the measured value and the predicted value is small, it can be determined that the state is within assumption (not abnormal) due to the differences in the arrangement and installation conditions between the energy storage devices in the energy storage system, or the like.

The abnormality factor determination unit 233 can be configured to include, for example, machine learning using a rule-based model (finding a rule by using machine learning), or can be configured to include a neural network model (learning apparatus). First, the rule-based model will be described.

FIG. 24 is an explanatory diagram showing an example of the rule-based model for determining an abnormality factor. In FIG. 24, four cases from No. 1 to No. 4 will be described for convenience. In the case of NO. 1, the determination result of the abnormality factor can be regarded as within assumption (no abnormality) when the measured cell current Ie is less than the threshold, the measured inter-cell voltage ΔV is less than a threshold, the measured inter-cell temperature ΔT is equal to or more than a threshold, the voltage difference ΔVec between the measured and predicted values is less than a threshold, and the temperature difference ΔTec between the measured and predicted values is less than the threshold. In this case, the operation support information of the energy storage system can be, for example, "Continue operation in the present situation."

In the case of NO. 2, the determination result of the abnormality factor can be regarded as an environmental abnormality when the measured cell current Ie is less than the threshold, the measured inter-cell voltage ΔV is less than a threshold, the measured inter-cell temperature ΔT is equal to or more than a threshold, the voltage difference ΔVec between the measured and predicted values is equal to or more than a threshold, and the temperature difference ΔTec between the measured and predicted values is less than the threshold. In this case, the operation support information of the energy storage system can be, for example, "Adjust air conditioning."

In the case of NO. 3, the determination result of the abnormality factor can be regarded as within assumption (no abnormality) when the measured cell current Ie is equal to or more than the threshold, the measured inter-cell voltage ΔV is equal to or more than a threshold, the measured inter-cell temperature ΔT is equal to or more than a threshold, the voltage difference ΔVec between the measured and predicted values is less than a threshold, and the temperature difference ΔTec between the measured and predicted values is less than the threshold. In this case, the operation support information of the energy storage system can be, for example, "Continue operation in the present situation."

In the case of NO. 4, the determination result of the abnormality factor can be regarded as an abnormality of the energy storage device when the measured cell current Ie is equal to or more than the threshold, the measured inter-cell voltage ΔV is equal to or more than a threshold, the measured inter-cell temperature ΔT is less than a threshold, the voltage difference ΔVec between the measured and predicted values is less than a threshold, and the temperature difference ΔTec between the measured and predicted values is equal to or more than the threshold. In this case, the operation support information of the energy storage system can be, for example, "Reduce load or exchange energy storage device."

Each threshold shown in FIG. 24 can be determined, for example, by machine learning.

The operation support information provision unit 234 has a function as the provision unit and can provide the operation support information of the energy storage system based on a result of the determination in the abnormality factor determination unit 233. As described above, for example, when it is determined that the energy storage device is abnormal, the operation support information provision unit 234 can provide information such as load reduction and replacement of the energy storage device. Further, when it is determined that the environment is abnormal, the operation support information provision unit 234 can provide information such as adjustment of air conditioning (e.g., lowering the temperature, etc.), and can provide operation support information for supporting the optimum operation of the energy storage system in accordance with the abnormality factor.

Next, the neural network model will be described.

Figure 25:
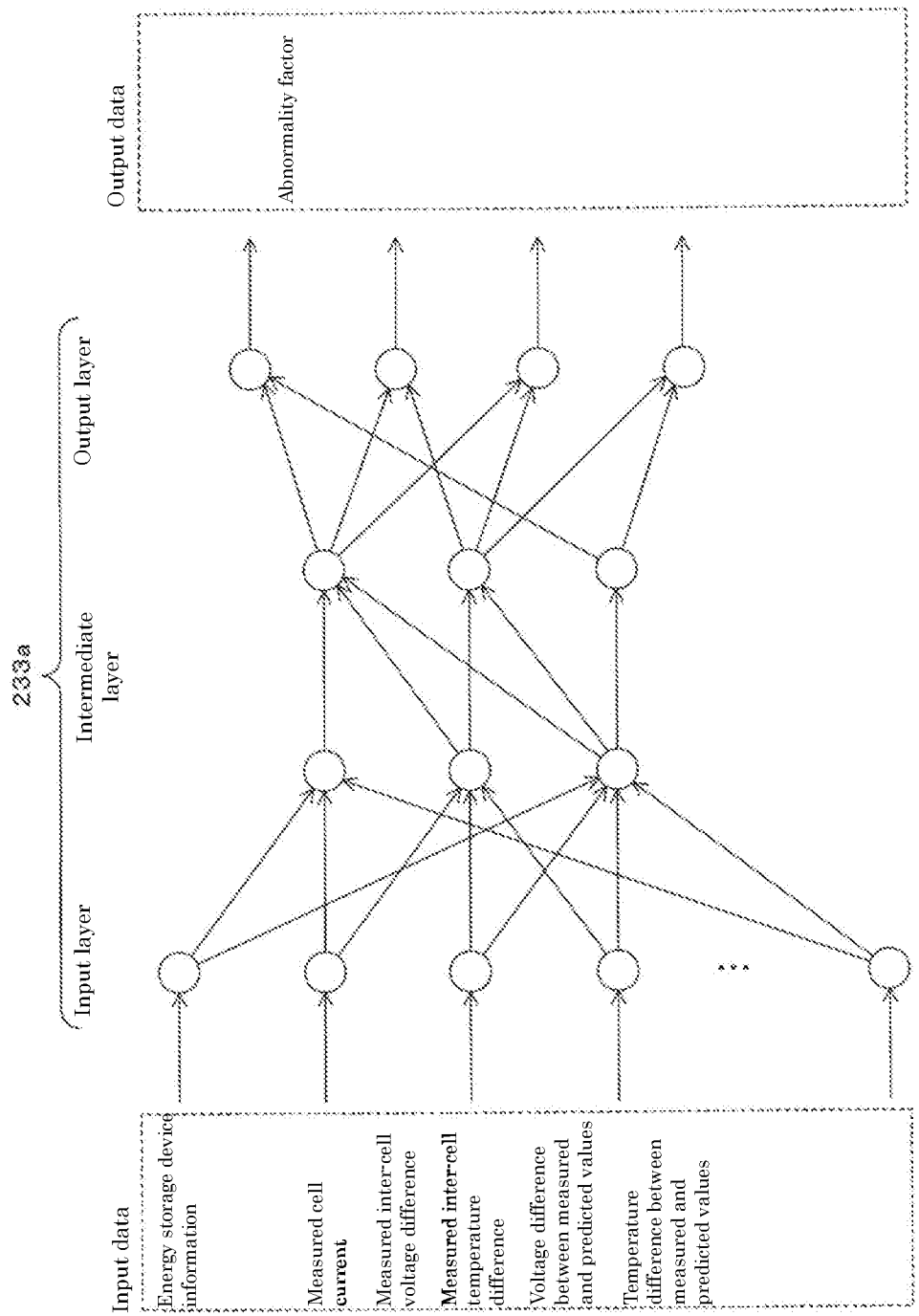
FIG. 25 is a schematic diagram showing an example of the configuration of the learning model.

FIG. 25 is a schematic diagram showing an example of the configuration of a learning model 233a. The learning model 233a is a neural network model including deep learning and is made up of an input layer, an output layer, and a plurality of intermediate layers. Although two intermediate layers are shown in FIG. 25 for convenience, the number of intermediate layers is not limited to two but may be three or more.

In the input layer, the output layer, and the intermediate layer, there are one or more nodes (neurons), and the node of each layer is coupled in one direction with a desired weight to each of the nodes existing in the preceding and succeeding layers. A vector having the same number of components as the number of nodes of an input layer is provided as input data of the learning model 233a (input data for learning and input data for determining an abnormality factor). The input data includes energy storage device information (SOC, full charge capacity, SOC-OCV (open circuit voltage) curve, internal resistance, etc.), a measured cell current, a measured inter-cell voltage, a voltage difference between measured and predicted values, a temperature difference between measured and predicted values, and the like. The output data includes abnormality factors (abnormality of the energy storage device, environmental abnormality, being within an assumed range and no abnormality, etc.).

The output data can be data in a vector format having components of the same size as the number of nodes (size of the output layer) of the output layer. For example, the output node can output probabilities of "abnormality of the energy storage device," "environmental abnormality," "the state of the energy storage device is within assumption," and "the state of the environment is within assumption," respectively.

The learning model 233a can be configured, for example, by combining hardware such as a CPU (e.g., multiple processors mounted with a plurality of processor cores, etc.), a graphics processing unit (GPU), a digital signal processor (DSP), a field-programmable gate array (FPGA), and the like.

The learning model 233a has learned based on learning data having, as input data, the measured value of the current of the plurality of energy storage devices, the measured voltage difference and the measured temperature difference between required storage devices, and the difference between the measured value and the predicted value with respect to each of the voltage and the temperature of one of the required storage devices, the leaning data having the abnormality factor as output data.

The learning model 233a has learned so as to output the abnormality of the one storage device when, for example, the measured current value and the measured voltage difference between the energy storage devices are large and the difference between the measured value and the predicted value is also large. The learning model 233a has learned so as to output a state within assumption (not abnormal) when the measured value of the current and the measured voltage difference between the energy storage devices are large and the difference between the measured value and the predicted value is small.

The learning model 233a has learned so as to output that the environment is abnormal when the measured value of the current is small, the measured temperature difference between the energy storage devices is large, and the difference between the measured value and the predicted value is also large. The learning model 233a has learned so as to output that the state is within assumption (not abnormal) when the measured value of the current is small, the measured temperature difference between the energy storage devices is large, and the difference between the measured value and the predicted value is small.

The abnormality factor determination unit 233 can input the measured value of the current acquired by the processing unit 23, the measured voltage difference and the measured temperature difference calculated by the first calculation unit 231, and the difference between the measured value and the predicted value calculated by the second calculation unit 232, into the learning model 233a to determine the abnormality factor. It is thereby possible to determine an abnormality factor (e.g., the abnormality of the energy storage device (degradation earlier than assumed, or the like) or the abnormality of the environment of the energy storage device). Further, since the abnormality of the energy storage device and the abnormality of the environment can be discriminated and determined, it is possible to prevent erroneous determination of the abnormality of the energy storage device.

Figure 26:
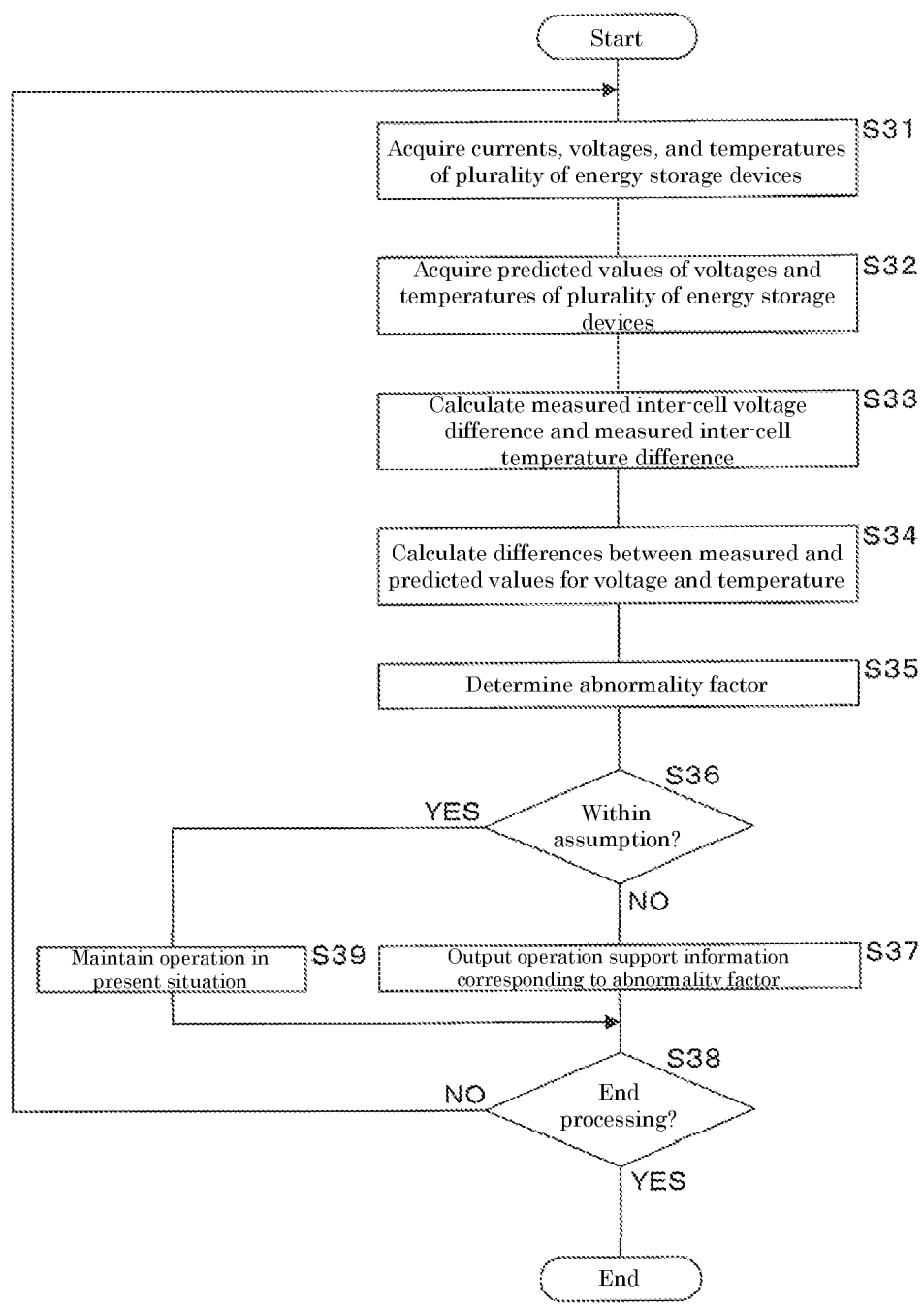
FIG. 26 is a flowchart showing an example of the processing procedure of the server apparatus according to the second embodiment.

FIG. 26 is a flowchart showing an example of the processing procedure of the server apparatus 2 according to the second embodiment. For convenience, the main part of the processing will be described as the processing unit 23. The processing unit 23 acquires measured values of the currents, voltages, and temperatures of the plurality of energy storage devices (S31) and acquires predicted values of the voltages and temperatures of the plurality of energy storage devices (S32).

The processing unit 23 calculates the measured inter-cell voltage and the measured inter-cell temperature (S33) and calculates the difference between the measured value and the predicted value with respect to the voltage and the temperature (S34). The processing unit 23 determines an abnormality factor (S35) and determines whether or not the cause is within assumption (S36).

When it is not within assumption (NO in S36), the processing unit 23 outputs operation support information corresponding to the abnormality factor (S37) and performs processing of S38 to be described later. When it is within assumption (YES in S36), the processing unit 23 maintains the operation in the present situation (S39) and determines whether or not to end the processing (S38). When the processing is not to be ended (NO in S38), the processing unit 23 continues the processing from S31, and when the processing is to be ended (YES in S38), the processing is ended.

The control unit 20 and the processing unit 23 of the present embodiment can also be achieved using a general-purpose computer provided with a CPU (processor), a GPU, a RAM (memory), and the like. That is, the control unit 20 and the processing unit 23 can be achieved on a computer by loading a computer program that determines the procedure of each processing, as shown in FIGS. 18, 19 and 26, into the RAM (memory) provided in the computer and executing the computer program with the CPU (processor). The computer program may be recorded on a recording medium and distributed. The learning model 26 caused to learn by the server apparatus 2, the computer program based on the learning model, and the data for learning may be distributed to and installed into the target apparatuses P, U, D, M for remote monitoring, the terminal apparatus (measurement monitor), the communication device 1, or the client apparatus 3 via the network N and the communication device 1. In this case, in the target apparatuses P, U, D, M, the terminal apparatus (measurement monitor), the communication device 1, or the client apparatus 3, the learning of the learning model 26 and the degradation determination by the learning-completed learning model 26 can be performed.

In the embodiment described above, the learning model 26 may be, for example, a recurrent neural network (regression neural networks: RNN). In this case, the intermediate layer of the previous time may be learned together with the input of the next time.

Embodiments are exemplary in all respects and are not restrictive. The scope of the present invention is defined by the claims and includes meanings equivalent to the claims and all modifications within the claims.

DESCRIPTION OF REFERENCE SIGNS

2: server apparatus
20: control unit
21: communications unit
22: storage unit
23: processing unit
231: first calculation unit
232: second calculation unit
233: abnormality factor determination unit
234: operation support information provision unit
24: predicted data generation unit
25: learning data generation unit
26, 233a: Learning model
27: learning processing unit
28: input data generation unit

The invention claimed is:

1. An abnormality factor determination apparatus for determining presence or absence of an abnormality factor relating to an energy storage system that includes a plurality of energy storage devices, the apparatus comprising:
   a measured value acquisition unit that acquires measured values, the measured values including electric values and temperature values of the plurality of energy storage devices;
   a predicted value acquisition unit that acquires predicted values, the predicted values including electric values and temperature values of the plurality of energy storage devices; and
   a determination unit that determines presence or absence of an abnormality factor relating to the energy storage system based on the measured values acquired by the measured value acquisition unit and the predicted values acquired by the predicted value acquisition unit,
   wherein the determination unit determines whether the abnormality factor is an abnormality of the energy storage device or an abnormality of an environment of the energy storage device.

2. The abnormality factor determination apparatus according to claim 1, comprising a provision unit that provides operation support information of the energy storage system based on a result of the determination in the determination unit.

3. The abnormality factor determination apparatus according to claim 1, further comprising:
   a first calculation unit that calculates a measured voltage difference and a measured temperature difference between certain energy storage devices based on the measured values acquired by the measured value acquisition unit; and
   a second calculation unit that calculates a difference between a measured value and a predicted value with respect to each of a voltage and a temperature of one of the certain energy storage devices based on the measured values acquired by the measured value acquisition unit and the predicted values acquired by the predicted value acquisition unit,
   wherein the determination unit determines the presence or absence of the abnormality factor based on a measured current value acquired by the measured value acquisition unit, the measured voltage difference and the measured temperature difference calculated by the first calculation unit, and the difference between the measured value and the predicted value calculated by the second calculation unit.

4. The abnormality factor determination apparatus according to claim 3, wherein:
the apparatus further comprises a learning apparatus caused to learn based on learning data having, as input data, the measured current values of the plurality of energy storage devices, the measured voltage difference and the measured temperature difference between the certain energy storage devices, and the difference between the measured value and the predicted value with respect to each of the voltage and the temperature of one of the certain energy storage devices, the learning data having the abnormality factor as output data, and
the determination unit inputs to the learning unit the measured current value acquired by the measured value acquisition unit, the measured voltage difference and the measured temperature difference calculated by the first calculation unit, and the difference between the measured value and the predicted value calculated by the second calculation unit, and determines presence or absence of an abnormality factor.

5. A degradation determination apparatus for determining degradation of an energy storage device, the apparatus comprising:
a measured data acquisition unit that acquires measured time-series data, the measured time-series data including a measured electric value and a measured temperature value of the energy storage device;
a predicted data acquisition unit that acquires predicted time-series data, the predicted time-series data including a predicted electric value and a predicted temperature value of the energy storage device; and
a learning processing unit that causes a learning model to learn based on learning data having the measured time-series data and the predicted time-series data as input data and having determination of degradation of the energy storage device as output data,
wherein the learning processing unit causes the learning model to learn based on learning data having, as input data, respective pieces of time-series data of a difference or a ratio between the measured electric value and the predicted electric value and a difference or a ratio between the measured temperature value and the predicted temperature value.

6. The degradation determination apparatus according to claim 5, wherein:
the measured data acquisition unit acquires measured time-series data including a measured voltage value of the energy storage device,
the predicted data acquisition unit acquires predicted time-series data including a predicted voltage value of the energy storage device, and
the learning processing unit causes the learning model to learn based on learning data having the measured time-series data that includes the measured voltage value and the predicted time-series data that includes the predicted voltage value as input data.

7. The degradation determination apparatus according to claim 6, wherein:
the measured data acquisition unit acquires measured time-series data including a measured current value of the energy storage device, the predicted data acquisition unit acquires predicted time-series data including a predicted current value of the energy storage device, and
the learning processing unit causes the learning model to learn based on learning data having the measured time-series data that includes the measured current value and the predicted time-series data that includes the predicted current value as input data.

8. The degradation determination apparatus according to claim 5, wherein:
the measured data acquisition unit acquires measured time-series data including a difference or a ratio between a measured electric value of each of the plurality of energy storage cells forming an energy storage module and an average value of the measured electric values of the plurality of energy storage cells, and
the learning processing unit causes the learning model to learn based on learning data having measured time-series data that includes the difference or the ratio as input data.

9. The degradation determination apparatus according to claim 5, wherein:
the predicted data acquisition unit acquires predicted time-series data including a difference or a ratio between a predicted electric value of each of the plurality of energy storage cells forming an energy storage module and an average value of the predicted electric values of the plurality of energy storage cells, and
the learning processing unit causes the learning model to learn based on learning data having predicted time-series data that includes the difference or the ratio as input data.

10. The degradation determination apparatus according to claim 5, wherein:
the predicted data acquisition unit acquires predicted time-series data that includes a difference or a ratio between a predicted temperature value of each of the plurality of energy storage cells forming an energy storage module and an average value of the predicted temperature values of the plurality of energy storage cells, and
the learning processing unit causes the learning model to learn based on learning data having predicted time-series data that includes the difference or the ratio as input data.

11. The degradation determination apparatus according to claim 5, wherein:
the measured data acquisition unit acquires measured time-series data including a measured pressure value of the energy storage device,
the predicted data acquisition unit acquires predicted time-series data including a predicted pressure value of the energy storage device, and
the learning processing unit causes the learning model to learn based on learning data having time-series data that includes a difference or a ratio between the measured pressure value and the predicted pressure value as input data.

12. The degradation determination apparatus according to claim 5, wherein the learning processing unit causes the learning model to learn based on learning data having presence or absence of an environmental abnormality relating to the energy storage device as output data.

13. The degradation determination apparatus according to claim 5, wherein deterioration of the energy storage device is determined using a learning-completed learning model caused to learn by the learning processing unit.

14. An abnormality factor determination apparatus for determining presence or absence of an abnormality factor relating to an energy storage system that includes a plurality of energy storage devices, the apparatus comprising:
- a measured value acquisition unit that acquires measured values, the measured values including electric values and temperature values of the plurality of energy storage devices;
- a predicted value acquisition unit that acquires predicted values, the predicted values including electric values and temperature values of the plurality of energy storage devices;
- a determination unit that determines presence or absence of an abnormality factor relating to the energy storage system based on the measured values acquired by the measured value acquisition unit and the predicted values acquired by the predicted value acquisition unit;
- a first calculation unit that calculates a measured voltage difference and a measured temperature difference between certain energy storage devices based on the measured values acquired by the measured value acquisition unit; and
- a second calculation unit that calculates a difference between a measured value and a predicted value with respect to each of a voltage and a temperature of one of the certain energy storage devices based on the measured values acquired by the measured value acquisition unit and the predicted values acquired by the predicted value acquisition unit, wherein the determination unit determines the presence or absence of the abnormality factor based on a measured current value acquired by the measured value acquisition unit, the measured voltage difference and the measured temperature difference calculated by the first calculation unit, and the difference between the measured value and the predicted value calculated by the second calculation unit.

15. The abnormality factor determination apparatus according to claim 14, wherein:
- the apparatus further comprises a learning apparatus caused to learn based on learning data having, as input data, the measured current values of the plurality of energy storage devices, the measured voltage difference and the measured temperature difference between the certain energy storage devices, and the difference between the measured value and the predicted value with respect to each of the voltage and the temperature of one of the certain energy storage devices, the learning data having the abnormality factor as output data, and
- the determination unit inputs to the learning unit the measured current value acquired by the measured value acquisition unit, the measured voltage difference and the measured temperature difference calculated by the first calculation unit, and the difference between the measured value and the predicted value calculated by the second calculation unit, and determines presence or absence of an abnormality factor.

\* \* \* \* \*